United States Patent
Ueno

(10) Patent No.: US 8,749,424 B2
(45) Date of Patent: Jun. 10, 2014

(54) COMPARATOR, ANALOG-TO-DIGITAL CONVERTOR, SOLID-STATE IMAGING DEVICE, CAMERA SYSTEM, AND ELECTRONIC APPARATUS

(71) Applicant: Sony Corporation, Tokyo (JP)

(72) Inventor: Yosuke Ueno, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/755,899

(22) Filed: Jan. 31, 2013

(65) Prior Publication Data
US 2013/0215303 A1    Aug. 22, 2013

(30) Foreign Application Priority Data
Feb. 20, 2012    (JP) .................. 2012-034394

(51) Int. Cl.
*H03M 1/56*    (2006.01)
(52) U.S. Cl.
CPC ..................................... *H03M 1/56* (2013.01)
USPC ........................... 341/169; 341/155; 341/172
(58) Field of Classification Search
CPC .................................................... G04F 10/105
USPC ......................................... 341/169, 172, 155
See application file for complete search history.

(56) References Cited

U.S. PATENT DOCUMENTS

| | | | | |
|---|---|---|---|---|
| 7,649,486 B2 * | 1/2010 | Toyomura et al. | ............. | 341/159 |
| 7,750,836 B2 * | 7/2010 | Muramatsu et al. | .......... | 341/169 |
| 7,999,717 B2 * | 8/2011 | Ohkawa et al. | ............... | 341/159 |
| 2010/0253560 A1 * | 10/2010 | Kudo | ............................ | 341/143 |
| 2011/0001648 A1 * | 1/2011 | Ohkawa et al. | ............... | 341/155 |

FOREIGN PATENT DOCUMENTS

| | | |
|---|---|---|
| JP | 63-209374 | 8/1988 |
| JP | 2005-278135 | 10/2005 |
| JP | 2005-295346 | 10/2005 |

\* cited by examiner

*Primary Examiner* — Jean B Jeanglaude
(74) *Attorney, Agent, or Firm* — Rader, Fishman & Grauer PLLC

(57) ABSTRACT

A comparator includes a first amplifier, a second amplifier, and a level holding part. The first amplifier includes differential-pair transistors and outputs a signal of a level corresponding to a comparison result from a first output node. The differential-pair transistors compare a reference voltage with a potential of an input signal. The second amplifier gain up the signal output from the first output node of the first amplifier and outputs the signal from a second output node. The level holding part holds a level of the second output node at a predetermined level. The second amplifier includes a transistor for amplification and a transistor for a current source. The level holding part holds the level of the second output node of the second amplifier such that the transistor for the current source does not fall into a level at which a saturated operation condition is not satisfied.

17 Claims, 29 Drawing Sheets

FIG.2
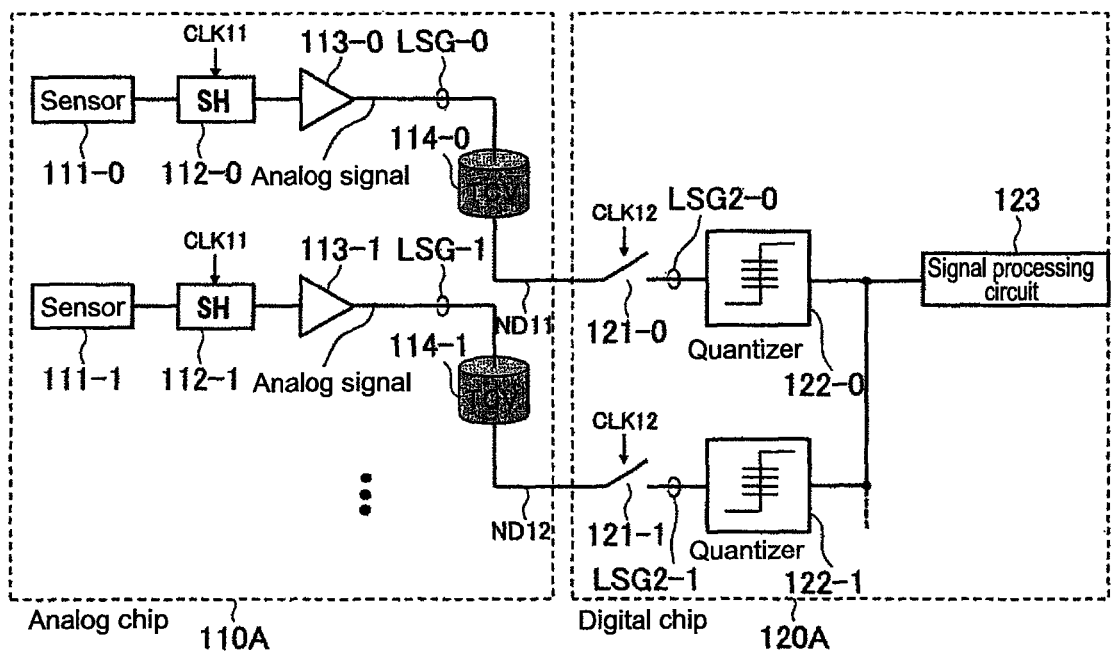
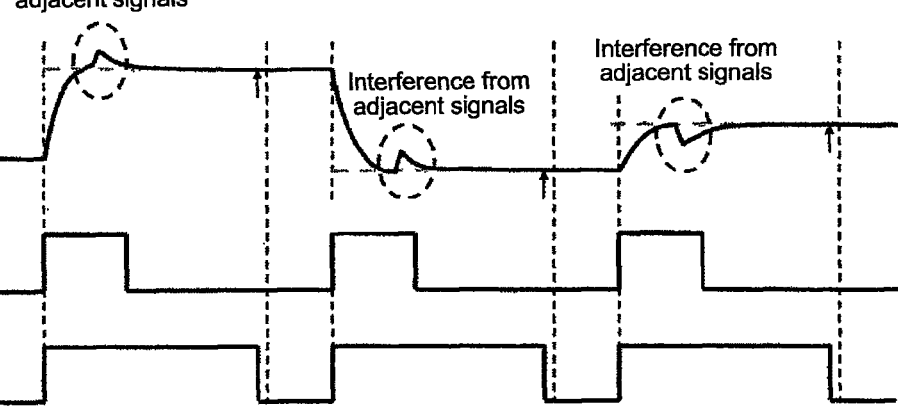
FIG.3A ND11 N11
FIG.3B CLK11
FIG.3C CLK12

CM inversion

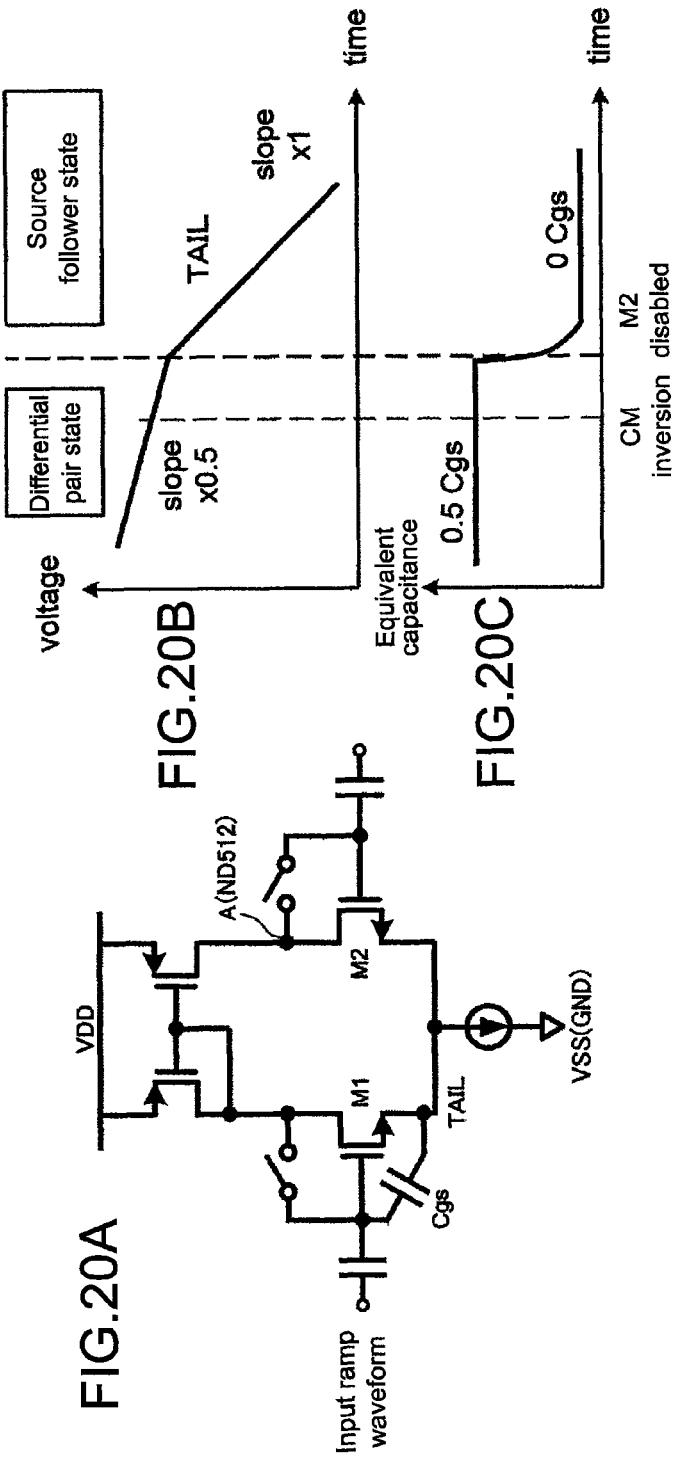

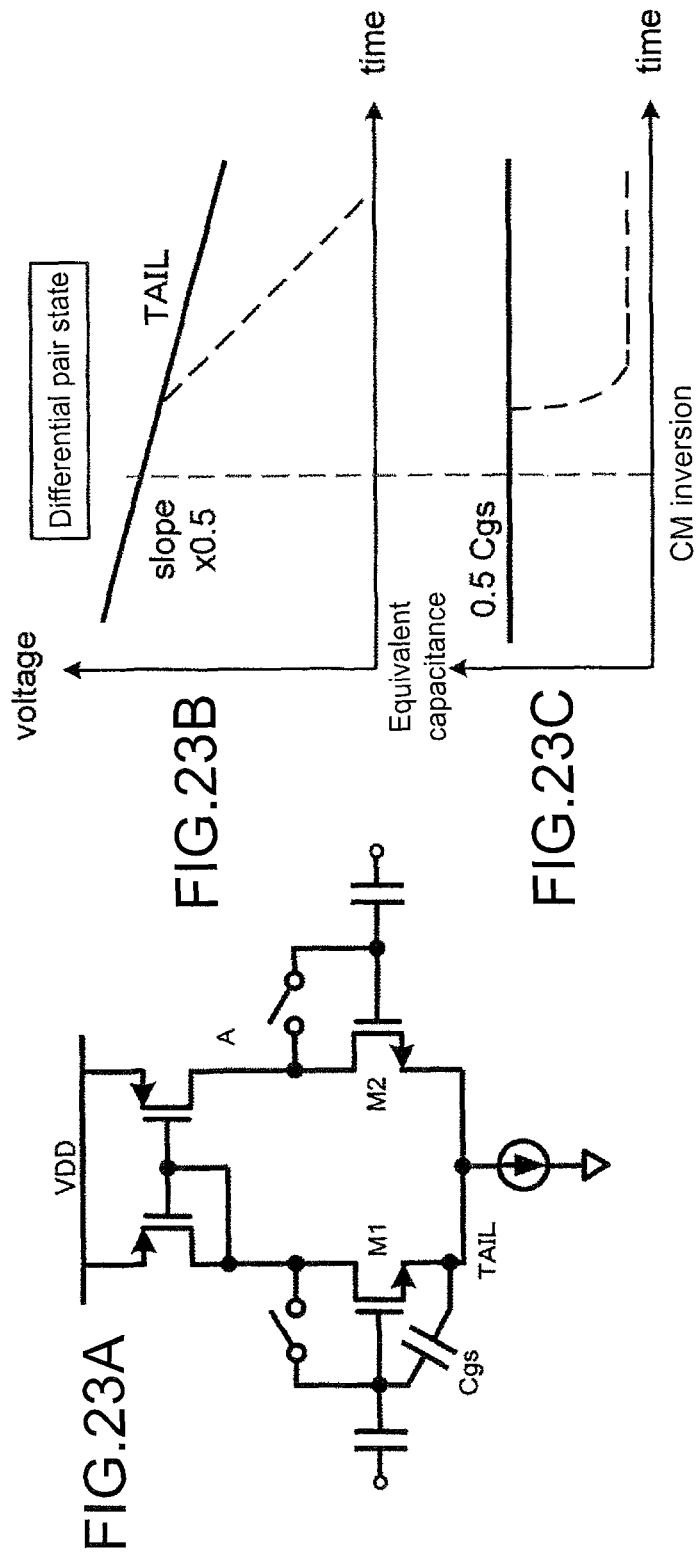

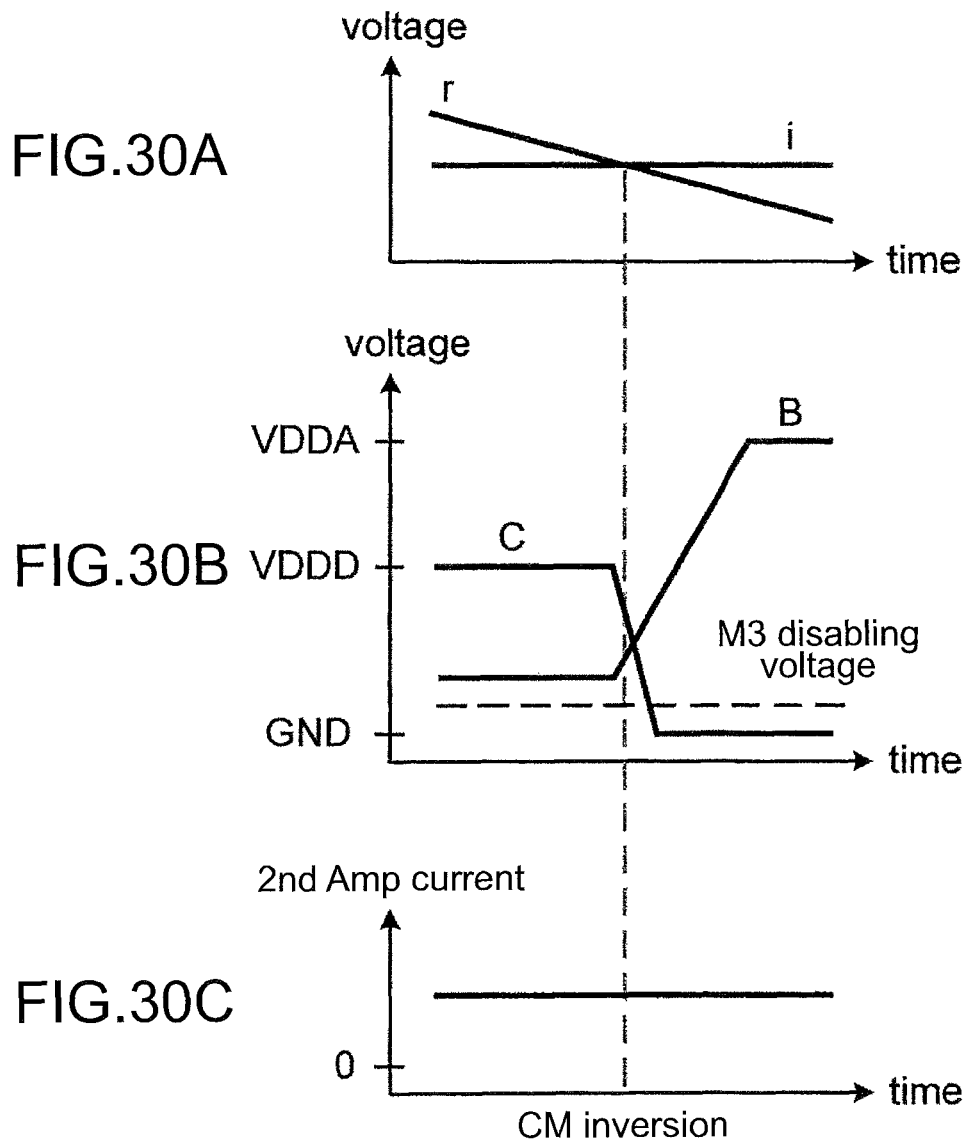

COMPARATOR, ANALOG-TO-DIGITAL CONVERTOR, SOLID-STATE IMAGING DEVICE, CAMERA SYSTEM, AND ELECTRONIC APPARATUS

BACKGROUND

The present disclosure relates to a comparator, a single-slope analog-to-digital (hereinafter referred to as an AD) converter, a solid-state imaging device represented by a CMOS image sensor, a camera system, and an electronic apparatus.

In recent years, attention has been paid to CMOS (Complementary Metal Oxide Semiconductor) image sensors as solid-state imaging devices (image sensors) instead of CCDs (Charge Coupled Devices) for the following reason.

As for the CCDs, it is necessary to take a dedicated process to manufacture CCD pixels, use a plurality of power supply voltages to operate the CCD pixels, and operate the CCD pixels in combination with a plurality of peripheral ICs (Integrated Circuits).

On the other hand, the CMOS image sensors address various problems such as a highly-complicated system of the CCDs. For this reason, the CMOS image sensors have received the attention.

In manufacturing a CMOS image sensor, it is possible to use the same manufacturing process as that of a general CMOS integrated circuit. In addition, it is possible to drive the CMOS image sensor with a single power supply. Moreover, it is possible to mix together an analog circuit and a logic circuit using a CMOS process in the same chip.

Therefore, the CMOS image sensor brings about a plurality of great advantages such as a reduction in the number of peripheral ICs.

In the output circuit of a CCD, a single channel (ch) output using a FD (Floating Diffusion) amplifier with a FD layer is in the mainstream.

On the other hand, the CMOS image sensor has a FD amplifier for each pixel. As an output of the CMOS image sensor, a column-parallel output is in the mainstream where the CMOS image sensor selects one of the rows of a pixel array and simultaneously reads the same in a column direction.

This is because parallel processing is advantageous due to the fact that it is difficult to obtain sufficient drive performance with the FD amplifiers arranged in the pixels and thus necessary to reduce a data rate.

As a signal output circuit of the column-parallel output CMOS image sensor, various types have been proposed.

As a method of reading a pixel signal in the CMOS image sensor, there has been known a method where a signal charge serving as a light signal generated by a photoelectric conversion device such as a photodiode is temporarily sampled by a capacitance via a MOS (Metal-Oxide Semiconductor) switch arranged near the photoelectric conversion device and then read.

In a sampling circuit, noise having an inverse correlation is generally caused in a sampling capacitance value.

In transferring a signal charge to a sampling capacitance, a pixel uses a potential slope to completely transfer the signal charge. Therefore, the noise is not caused in the sampling process but is caused when a voltage level of a previous capacitance is reset to a certain reference value.

As a general method of eliminating noise, CDS (Correlated Double Sampling) has been known. In this method, a signal charge in a state immediately before its sampling (reset level) is once read and stored, and then a signal level after the sampling is read and subtracted from the reset level to eliminate the noise.

Specific methods of the CDS include various techniques.

In addition, as a pixel signal reading (outputting) circuit of the column-parallel output CMOS image sensor, various types have been proposed. Among them, the most advanced type is a circuit that includes an AD converter (hereinafter referred to as an ADC) for each column and fetches a pixel signal as a digital signal.

The CMOS image sensors having such column-parallel ADCs are disclosed in, for example, "An Integrated 800×600 CMOS Image system" (ISSCC Digest of Technical Papers, pp. 304-305, February, 1999, by W. Yang et. al), Japanese Patent Application Laid-open No. 2005-278135, Japanese Patent Application Laid-open No. 2005-295346, and Japanese Patent Application Laid-open No. 63-209374.

SUMMARY

As described above, a single-slope AD converter causes a comparator to compare ramp waves from a DAC (or a ramp generator) with an input signal of the AD converter and controls a subsequent counter, thereby performing AD conversion.

In a case where a multiplicity of single-slope AD converters are constructed as represented by the column-parallel single-slope AD converter of the CMOS image sensor, the above ramp waves are commonalized by the multiplicity of AD converters.

Therefore, if the ramp waves are fluctuated by an influence of the comparator in response to the operation of one of the AD converters, the other AD converters suffer from the influence and are caused to have an error in their AD conversion results.

In the CMOS image sensor, for example, if a bright region (or a dark region) exists, the brightness (or the darkness) spreads in a column direction, which results in the degradation of image quality.

Note that in the following description, such a phenomenon is called a streaking phenomenon.

One of the causes for the streaking phenomenon is a time fluctuation in a consumption current at the inversion of the output of a comparator circuit.

A power supply has a finite impedance. Therefore, a power supply voltage fluctuates when a consumption current of a comparator fluctuates at the inversion of the comparator.

Thus, inversion times of other comparators are influenced, which results in a cause for the streaking phenomenon.

The present disclosure has been made in view of the above circumstances, and it is therefore desirable to provide a comparator, an AD converter, a solid-state imaging device, a camera system, and an electronic apparatus capable of reducing noise (error) caused in the power supply of a comparator, achieving an improvement in the precision of a system, and reducing an error in the AD converter and the degradation of image quality.

According to a first embodiment of the present disclosure, there is provided a comparator including a first amplifier, a second amplifier, and a level holding part. The first amplifier includes differential-pair transistors and is configured to output a signal of a level corresponding to a comparison result from a first output node. The differential-pair transistors serve as a comparison part configured to compare a reference voltage with a potential of an input signal. The second amplifier is configured to gain up the signal output from the first output node of the first amplifier and output the signal from a second output node. The level holding part is configured to hold a level of the second output node at a predetermined level. The second amplifier includes a transistor for amplification and a transistor for a current source. The transistor for amplification is connected between the second output node and a power supply or a reference potential source. The transistor for the current source is connected between the second output node and the reference potential source or the power supply. The level holding part holds the level of the second output node of the second amplifier such that the transistor for the current source of the second amplifier does not fall into a level at which a saturated operation condition is not satisfied.

According to a second embodiment of the present disclosure, there is provided an analog-to-digital converter including a comparator and a counter. The comparator is configured to compare a reference voltage, a signal level of which changes with a slope, with an input signal for determination and to output a signal of the determination. The counter is configured to count a comparison time of the comparator to obtain a digital signal. The comparator includes a first amplifier, a second amplifier, and a level holding part. The first amplifier includes differential-pair transistors and is configured to output a signal of a level corresponding to a comparison result from a first output node. The differential-pair transistors serve as a comparison part configured to compare the reference voltage with a potential of the input signal. The second amplifier is configured to gain up the signal output from the first output node of the first amplifier and output the signal from a second output node. The level holding part is configured to hold a level of the second output node at a predetermined level. The second amplifier includes a transistor for amplification and a transistor for a current source. The transistor for amplification is connected between the second output node and a power supply or a reference potential source. The transistor for the current source is connected between the second output node and the reference potential source or the power supply. The level holding part holds the level of the second output node of the second amplifier such that the transistor for the current source of the second amplifier does not fall into a level at which a saturated operation condition is not satisfied.

According to a third embodiment of the present disclosure, there is provided a solid-state imaging device including a pixel array part and a pixel signal reading part. The pixel array part has a plurality of pixels arranged in matrix form. The pixels are configured to perform photoelectric conversion. The pixel signal reading part is configured to read pixel signals in units of the plurality of pixels from the pixel array part. The pixel signal reading part includes an analog-to-digital converter configured to convert an analog reading signal into a digital signal. The analog-to-digital converter includes a comparator and a counter. The comparator is configured to compare a reference voltage, a signal level of which changes with a slope, with an input signal for determination and to output a signal of the determination. The counter is configured to count a comparison time of the comparator to obtain a digital signal. The comparator includes a first amplifier, a second amplifier, and a level holding part. The first amplifier includes differential-pair transistors and is configured to output a signal of a level corresponding to a comparison result from a first output node. The differential-pair transistors serve as a comparison part configured to compare the reference voltage with the potential of the input signal. The second amplifier is configured to gain up the signal output from the first output node of the first amplifier and output the signal from a second output node. The level holding part is configured to hold a level of the second output node at a predetermined level. The second amplifier includes a transistor for amplification and a transistor for a current source. The transistor for amplification is connected between the second output node and a power supply or a reference potential source. The transistor for the current source is connected between the second output node and the reference potential source or the power supply. The level holding part holds the level of the second output node of the second amplifier such that the transistor for the current source of the second amplifier does not fall into a level at which a saturated operation condition is not satisfied.

According to a fourth embodiment of the present disclosure, there is provided a camera system including a solid-state imaging device and an optical system. The optical system is configured to form a subject image on the solid-state imaging device. The solid-state imaging device includes a pixel array part and a pixel signal reading part. The pixel array part has a plurality of pixels arranged in matrix form. The pixels are configured to perform photoelectric conversion. The pixel signal reading part is configured to read pixel signals in units of the plurality of pixels from the pixel array part. The pixel signal reading part includes an analog-to-digital converter configured to convert an analog reading signal into a digital signal. The analog-to-digital converter includes a comparator and a counter. The comparator is configured to compare a reference voltage, a signal level of which changes with a slope, with an input signal for determination and to output a signal of the determination. The counter is configured to count a comparison time of the comparator to obtain a digital signal. The comparator includes a first amplifier, a second amplifier, and a level holding part. The first amplifier includes differential-pair transistors and is configured to output a signal of a level corresponding to a comparison result from a first output node. The differential-pair transistors serve as a comparison part configured to compare a reference voltage with a potential of an input signal. The second amplifier is configured to gain up the signal output from the first output node of the first amplifier and output the signal from a second output node. The level holding part is configured to hold a level of the second output node at a predetermined level. The second amplifier includes a transistor for amplification and a transistor for a current source. The transistor for amplification is connected between the second output node and a power supply or a reference potential source. The transistor for the current source is connected between the second output node and the reference potential source or the power supply. The level holding part holds the level of the second output node of the second amplifier such that the transistor for the current source of the second amplifier does not fall into a level at which a saturated operation condition is not satisfied.

According to a fifth embodiment of the present disclosure, there is provided an electronic apparatus including at least a comparator for use in a signal processing system. The comparator includes a first amplifier, a second amplifier, and a level holding part. The first amplifier includes differential-pair transistors and is configured to output a signal of a level corresponding to a comparison result from a first output node. The differential-pair transistors serve as a comparison part configured to compare a reference voltage with a potential of an input signal. The second amplifier is configured to gain up the signal output from the first output node of the first amplifier and output the signal from a second output node. The level holding part is configured to hold a level of the second output node at a predetermined level. The second amplifier includes a transistor for amplification and a transistor for a current source. The transistor for amplification is connected between the second output node and a power supply or a reference potential source. The transistor for the current source is connected between the second output node and the reference potential source or the power supply. The level holding part holds the level of the second output node of the second amplifier such that the transistor for the current source of the second amplifier does not fall into a level at which a saturated operation condition is not satisfied.

According to the embodiments of the present disclosure, it is possible to reduce noise (error) caused in the power supply of a comparator, achieve an improvement in the precision of a system, and reduce an error in an AD converter and the degradation of image quality.

These and other objects, features and advantages of the present disclosure will become more apparent in light of the following detailed description of best mode embodiments thereof, as illustrated in the accompanying drawings.

BRIEF DESCRIPTION OF DRAWINGS

FIG. 2 is a diagram showing a first arrangement configuration example of circuits or the like in a semiconductor device according to the embodiment;

FIGS. 3A to 3C are diagrams showing the time relationship between the signals of the semiconductor device according to the embodiment;

FIGS. 20A to 20C are diagrams, respectively, showing a parasitic capacitance of the comparator shown in FIG. 18, an operation waveform of the comparator, and a change in an equivalent capacitance at the operation of the comparator;

FIGS. 23A to 23C are diagrams, respectively, showing a parasitic capacitance of the comparator shown in FIG. 17, an operation waveform of the comparator, and a change in an equivalent capacitance at the operation of the comparator;

FIGS. 30A to 30C are diagrams showing operation waveforms of the comparator shown in FIG. 27;

DETAILED DESCRIPTION OF EMBODIMENTS

Hereinafter, a description will be given of an embodiment of the present disclosure with reference to the drawings.

Note that the description will be given in the following order.

Figure 1:
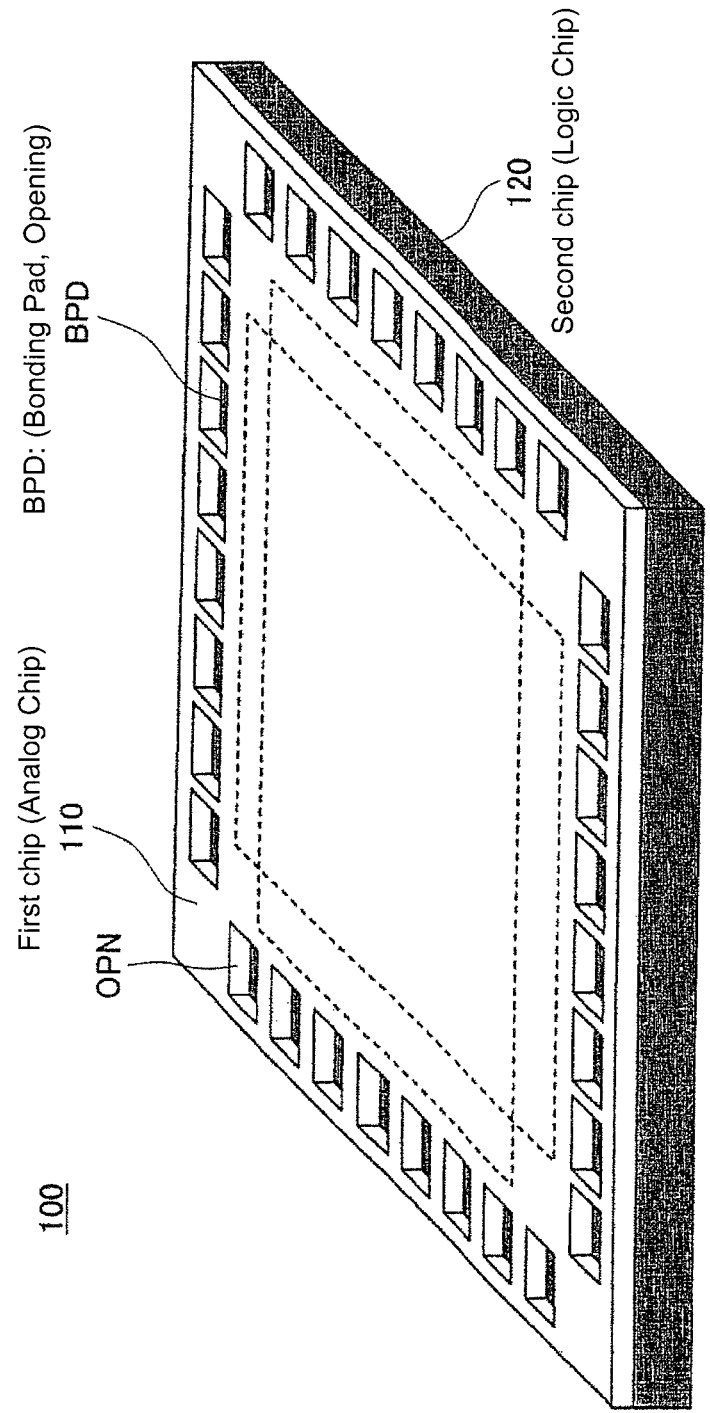
FIG. 1 is a diagram showing an example of the laminated structure of a semiconductor device according to an embodiment of the present disclosure.

(1) Outline of Semiconductor Device
(1-1) First Arrangement Configuration Example in Semiconductor Device
(1-2) Second Arrangement Configuration Example in Semiconductor Device (1-3) Third Arrangement Configuration Example in Semiconductor Device
(2) Outline of Solid-State Imaging Device
(2-1) Basic Configuration Example of Solid-State Imaging Device
(2-2) Configuration Example of Solid-State Imaging Device Having Column-Parallel ADCs
(2-3) First Arrangement Configuration Example in Solid-State Imaging Device
(2-4) Second Arrangement Configuration Example in Solid-State Imaging Device
(2-5) Third Arrangement Configuration Example in Solid-State Imaging Device
(3) Configuration Example of Comparator
(3-1) Basic Concept of First Configuration Example of Comparator
(3-2) Specific Circuit of First Configuration Example of Comparator
(3-3) Modification of First Configuration Example of Comparator
(3-4) Basic Concept of Second Configuration Example of Comparator
(3-5) Specific Circuit of Second Configuration Example of Comparator
(3-6) Modification of Second Configuration Example of Comparator
(3-7) Specific Circuit of Third Configuration Example of Comparator
(3-8) Modification of Third Configuration Example of Comparator
(4) Configuration Example of Camera System
(5) Application to Electronic Apparatus (1) Outline of Semiconductor Device FIG. 1 is a diagram showing an example of the laminated structure of a semiconductor device according to the embodiment.

A semiconductor device 100 according to the embodiment has a plurality of sensors arranged in array form and including photoelectric conversion elements and the like.

Hereinafter, a configuration example of the semiconductor device having such a configuration will be first described. Then, a configuration example of a CMOS image sensor serving as a solid-state imaging device will be described as an example of the semiconductor device.

Further, a description will be given of a specific configuration example of a single slope AD converter capable of reducing an error caused in an input waveform, achieving an improvement in precision without incurring an increase in a consumption current, noise, and an area, reducing an error in the AD converter and the degradation of image quality, and being applied to the solid-state imaging device.

As shown in FIG. 1, the semiconductor device 100 has the laminated structure of a first chip (upper chip) 110 and a second chip (lower chip) 120.

The laminated first and second chips 110 and 120 are electrically connected to each other through via holes (TC(S)Vs (Through Contact (Silicon) Vias) formed in the first chip 110.

The semiconductor device 100 is formed to have the laminated structure in such a manner that the first and second chips 110 and 120 are bonded together at a wafer level and cut out by dicing.

In the laminated structure of the upper and lower two chips, the first chip 110 is an analog chip (sensor chip) having the plurality of sensors arranged in array form.

The second chip 120 is a logic chip (digital chip) including circuits that quantize analog signals transferred from the first chip 110 through the TCVs and a signal processing circuit.

The second chip 120 has a bonding pad BPD and an input/output circuit, and the first chip 110 has openings OPN for use in wire-bonding to the second chip 120.

The semiconductor device 100 of the laminated structure of the two chips according to the embodiment has the following characteristic configuration.

The electrical connection between the first chip 110 and the second chip 120 is performed through, for example, the via holes (hereinafter may be also referred to as TCVs).

The TCVs are arranged at chip ends or between the pad and a circuit region.

The TCVs for transmitting control signals and supplying power are mainly concentrated at, for example, the four corners of the chip, by which the signal wiring region of the first chip 110 can be reduced.

A reduction in the number of the wiring layers of the first chip 110 results in an increase in the resistance of a power supply line and an increase in IR-Drop. As countermeasures for this problem, the effective arrangement of the TCVs can improve the noise control, stable supply, or the like of a power supply in the first chip 110 using the wiring of the second chip 120.

(1-1) First Arrangement Configuration Example in Semiconductor Device

FIG. 2 is a diagram showing a first arrangement configuration example of circuits or the like in a semiconductor device according to the embodiment.

In a semiconductor device 100A shown in FIG. 2, a first chip 110A and a second chip 120A are two-dimensionally developed to facilitate the understanding of the arrangement of the circuits such as the first chip 110A and the second chip 120A of a laminated structure.

The first chip 110A has a plurality of sensors 111 (111-0, 111-1, etc.) arranged in array form and first signal lines LSG1 (LSG1-0, LSG1-1, etc.) that transmit analog signals (sensor signals) output from the sensors 111 (111-0, 111-1, etc.).

In the first chip 110A, sample hold (SH) circuits 112(112-0, 112-1, etc.) that sample the sensor signals of the sensors 111(111-0, 111-1, etc.) at a first clock CLK11 are arranged on the first signal lines LSG1 (LSG1-0, LSG-1, etc.).

On the first signal lines LSG1 (LSG1-0, LSG1-1, etc.), amplifiers 113 (113-0, 113-1, etc.) that amplify the sensor signals output from the sample hold (SH) circuits 112 (112-0, 112-1, etc.) are arranged.

Further, the first chip 110A has TCVs 114 (114-0, 114-1, etc.) that electrically connect the first signal lines LSG1 (LSG1-0, LSG1-1, etc.) to the second chip 120A and transmit the sensor signals.

Note that although not shown in the figure, the first chip 110A also has TCVs for supplying power and transmitting control signals.

The second chip 120A has second signal lines LSG2 (LSG2-0, LSG2-1, etc.) connected to the respective TCVs 114 formed in the first chip 110A.

On the second signal lines LSG2 (LSG2-0, LSG2-1, etc.), sampling switches 121 (121-0, 121-1, etc.) that sample the sensor signals transmitted through the TCVs 114 at a second clock CLK12 are arranged.

On the second signal lines LSG2 (LSG2-0, LSG2-1, etc.), quantizers 122 (122-0, 122-1, etc.) that quantize the signals sampled by the sampling switches 121 (121-0, 121-1, etc.) are arranged.

The second chip 120A has a signal processing circuit 123 that performs the digital calculation processing of the signals quantized by the quantizers 122 (122-0, 122-1, etc.).

In the semiconductor device 100A, the signals output from the sensors 111 are sample-held by the SH circuits 112 and then transmitted to the TCVs 114 through the amplifiers 113.

Here, if the power of the signals output from the sensors 111 is sufficiently large, the amplifiers 113 may not be arranged.

The signals transmitted through the TCVs 114 are sampled by the sampling switches 121 of the second chip 120A serving as a logic chip (digital chip) and then quantized by the quantizers 122 in a voltage direction. The data thus digitized is calculated by the signal processing circuit 123.

According to the embodiment of the present disclosure, the signals transmitted through the TCVs 114 are discretized in a time direction. In other words, the signals transmitted through the TCVs 114 are continuous signals, i.e., discrete-time analog signals in a voltage direction.

Also in this case, interference from the adjacent TCVs 114 occurs in the signals.

However, the interference from the adjacent TCVs with respect to the signals can be prevented by appropriately controlling the timing of the first clock CLK11 at which the signals are sample-held by the SH circuits 112 and the timing of the second clock CLK12 at which the discrete-time analog signals are sampled in the second chip 120A.

FIGS. 3A to 3C are diagrams showing the time relationship between the signals of the semiconductor device according to the embodiment.

FIG. 3A shows the signal waveform of a node ND11 to which the signal transmitted through the TCV 114 is supplied, FIG. 3B shows the first clock CLK11, and FIG. 3C shows the second clock CLK12.

Attention is now paid to the node ND11 of the discrete-time analog signal transmitted through the TCV 114.

Because the first clock CLK11 uses the timing common to the SH circuits 112 connected to all the sensors 111, the signal transition time of the node ND11 and that of the adjacent node ND12 are ideally synchronized with each other.

However, if an error occurs in the timing for outputting the signal from the sensor 111 between the node ND11 and the node ND12 due to, for example, the delay of the signal through the wiring, a whisker resulting from the interference is caused in the signal of the node ND11 as shown in FIG. 3A.

However, the signal has been time-discretized by the SH circuit 112 in an interval where one data is transmitted. Therefore, the signal has a fixed value in the interval and is stabilized at a desired value after the lapse of a sufficient time.

The semiconductor device is so driven as to perform the sampling using the second clock CLK12 at the timing at which the signal is stabilized at the substantial value, thereby making it possible to reduce the error caused by the interference from the TCVs 114 to a negligible level.

(1-2) Second Arrangement Configuration Example in Semiconductor Device

Figure 4:
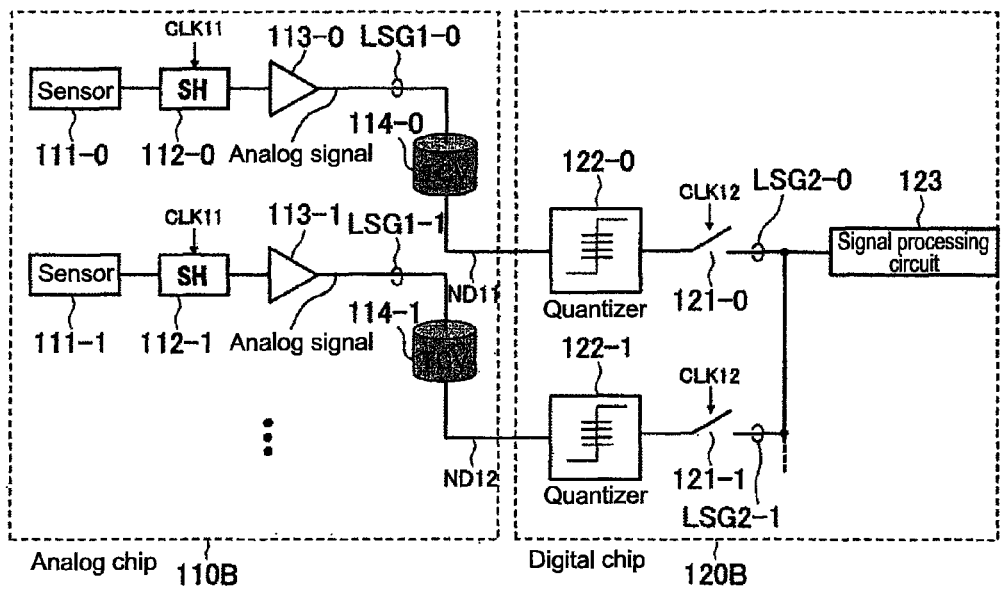
FIG. 4 is a diagram showing a second arrangement configuration example of the circuits or the like in a semiconductor device according to the embodiment.

FIG. 4 is a diagram showing a second arrangement configuration example of the circuits or the like in a semiconductor device according to the embodiment.

A semiconductor device 100B shown in FIG. 4 is different from the semiconductor device 100A shown in FIG. 2 in the following point.

That is, in a second chip 120B, the sampling switches 121 (121-0, 121-1, etc.) and the quantizers 122(122-0, 122-1, etc.) are arranged on the second signal lines LSG2(LSG2-0, LSG2-1, etc.) in a reverse order (reversely connected).

According to the embodiment of the present disclosure, the sampling and the quantization at the second clock CLK12 may be performed in the order of the quantization in a continuous time and the sampling by the sampling switches 121 connected to the quantizers 122.

In this case, the operations of the sampling switches 121 are realized by the provision of flip-flop circuits with respect to the signals.

The configuration of the semiconductor device 100A shown in FIG. 2 may cause kT/C noise when the sampling switches 121 are turned off. However, the configuration of the semiconductor device 100B shown in FIG. 4 is free from kT/C noise.

(1-3) Third Arrangement Configuration Example in Semiconductor Device

Figure 5:
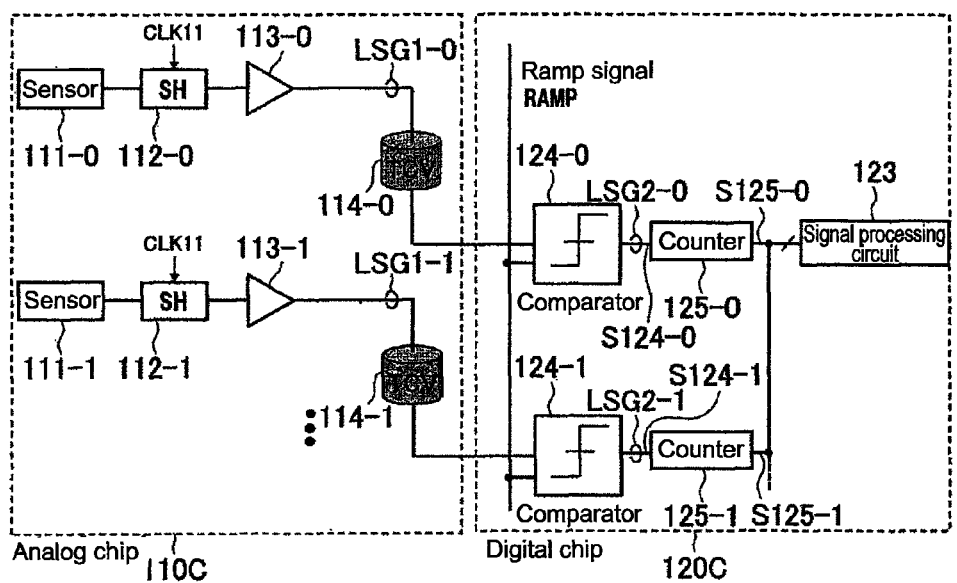
FIG. 5 is a diagram showing a third arrangement configuration example of the circuits or the like in a semiconductor device according to the embodiment.

FIG. 5 is a diagram showing a third arrangement configuration example of the circuits or the like in a semiconductor device according to the embodiment.

A semiconductor device 100C shown in FIG. 5 is different from the semiconductor devices 100A and 100B shown in FIGS. 2 and 4 in the following point.

That is, a second chip 120C has comparators 124 (124-0, 124-1, etc.) and counters 125(125-0, 125-1, etc.) instead of the sampling switches and the quantizers.

In the second chip 120C, the comparators 124 compare a ramp signal RAMP with the sensor signals transmitted through the TCVs 114 to perform conversion from a voltage axis to a time axis, and then the counters 125 quantizes time information.

Figure 6:
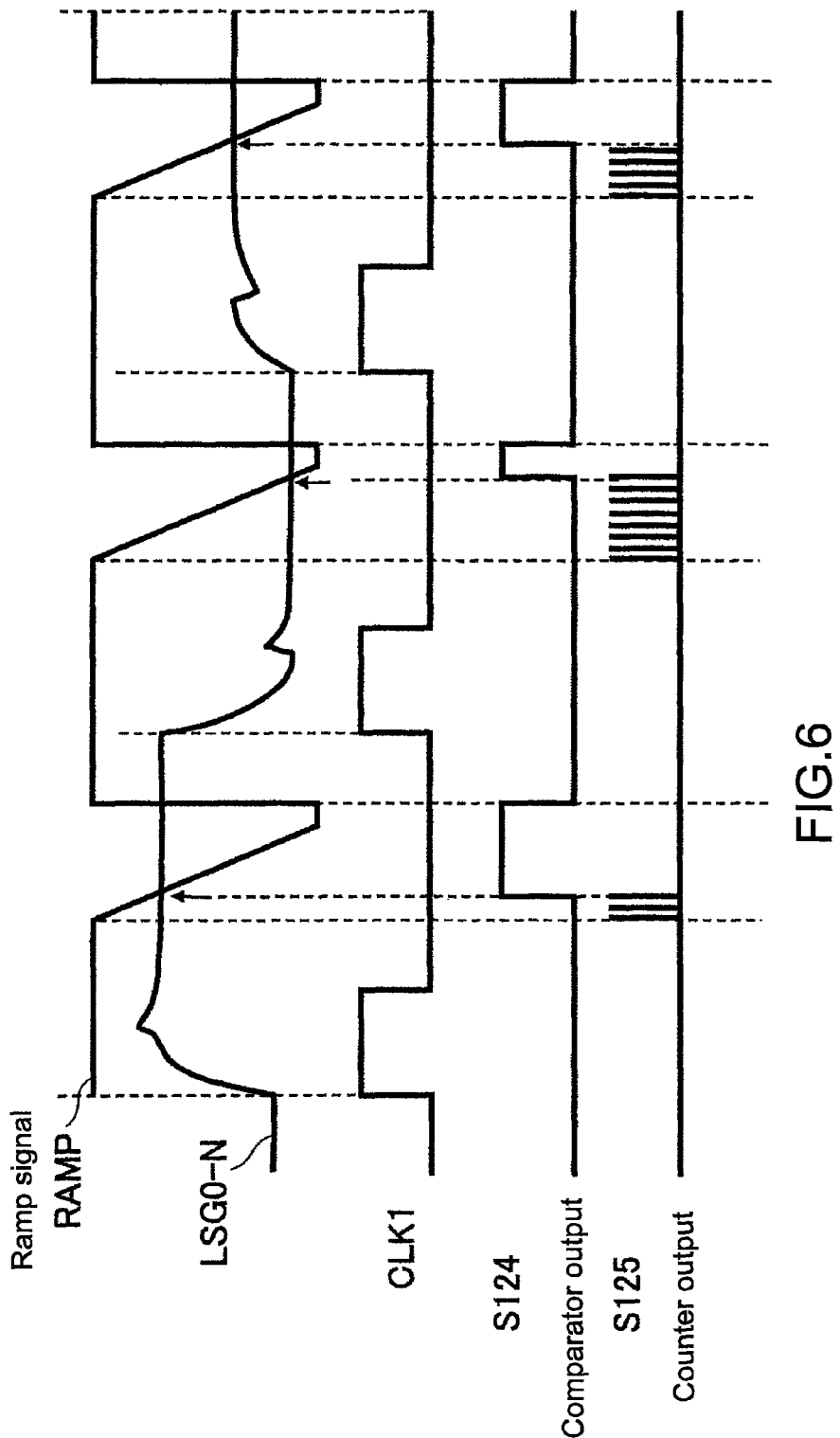
FIG. 6 is a diagram showing the operation of the semiconductor device shown in FIG. 3 using waveforms in a time axis, which represents that interference from adjacent columns can be reduced.

FIG. 6 shows that the interference from the adjacent columns can be reduced based on the same principle as the configuration shown in FIG. 3. In the configuration shown in FIG. 5, an AD conversion operation is performed in such a manner that the ramp waves RAMP are compared with the signals and the time is converted into digital values by the counters 125. Accordingly, the AD converter does not fetch the signals while the ramp waves and counters 124 do not operate.

Here, as shown in FIG. 6, the semiconductor device starts the transition of the ramp waves and the operations of the counters 125 after the output of the signal LSGO-N is substantially stabilized, thereby making it possible to reduce the error caused by the interference from the adjacent TCVs as in the case of the semiconductor device shown in FIG. 3.

(2) Outline of Solid-State Imaging Device

A description will be given of a configuration example of a CMOS image sensor serving as a solid-state imaging device as an example of the semiconductor device according to the embodiment.

(2-1) Basic Configuration of Solid-State Imaging Device

Figure 7:
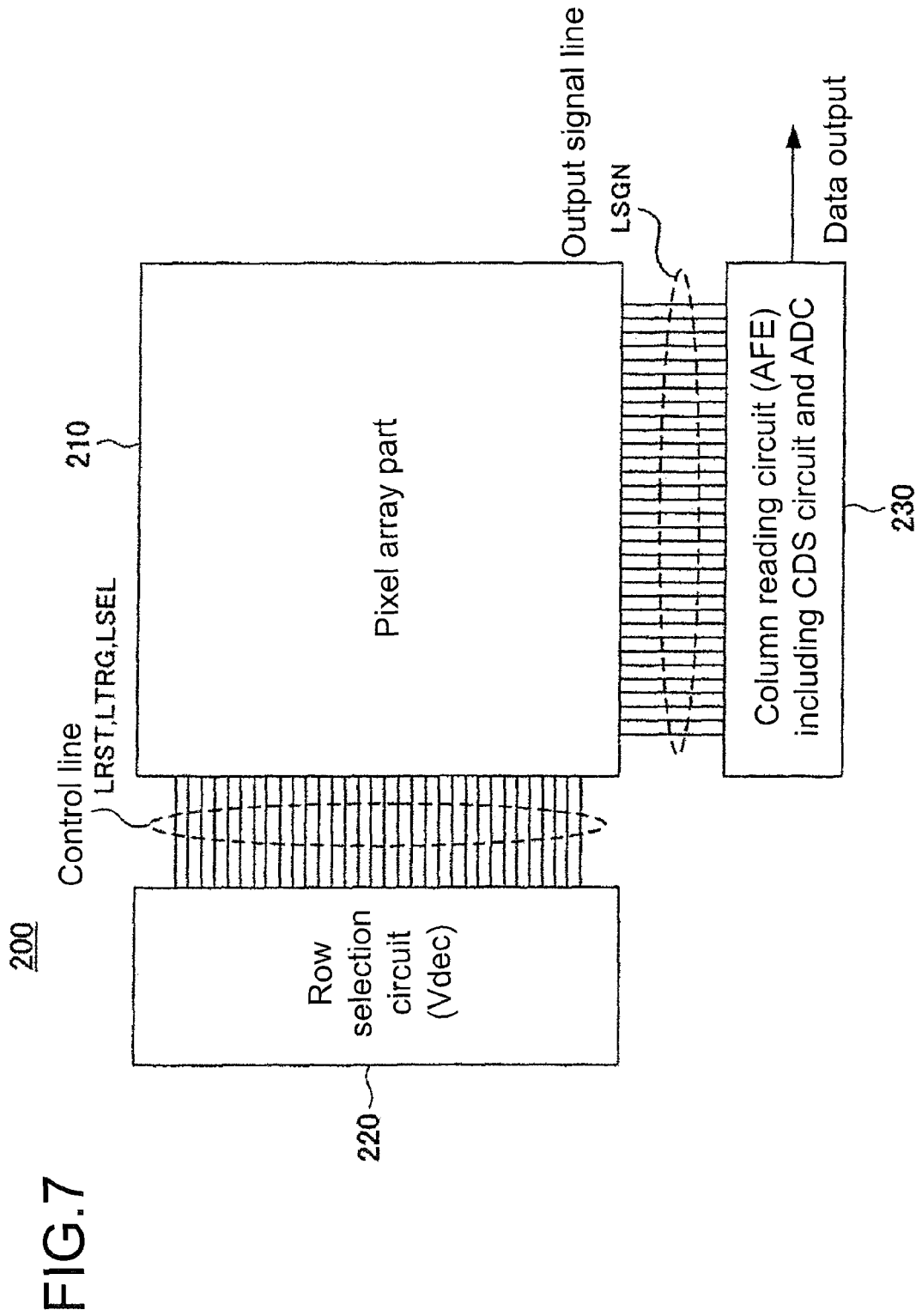
FIG. 7 is a diagram showing a basic configuration example of a CMOS image sensor (solid-state imaging device) according to the embodiment.

FIG. 7 is a diagram showing a basic configuration example of a CMOS image sensor (solid-state imaging device) according to the embodiment.

A CMOS image sensor 200 shown in FIG. 7 has a pixel array part 210, a row selection circuit (Vdec) 220, and a column reading circuit (AFE) 230.

The row selection circuit 220 and the column reading circuit 230 form a pixel signal reading part.

The CMOS image sensor 200 serving as a semiconductor device employs the laminated structure shown in FIG. 1.

According to the embodiment, the laminated structure is basically configured such that the first chip 110 has the pixel array part 210 and the second chip 120 has the row selection circuit 220 and the column reading circuit 230 forming the pixel signal reading part.

Signals for driving pixels, analog read signals of the pixels (sensors), a power supply voltage, and the like are transferred between the first chip 110 and the second chip 120 through the TCVs formed in the first chip 110.

The pixel array part 210 has a plurality of pixel circuits 210A two-dimensionally arranged in M (rows)×N (columns) (matrix) form.

Figure 8:
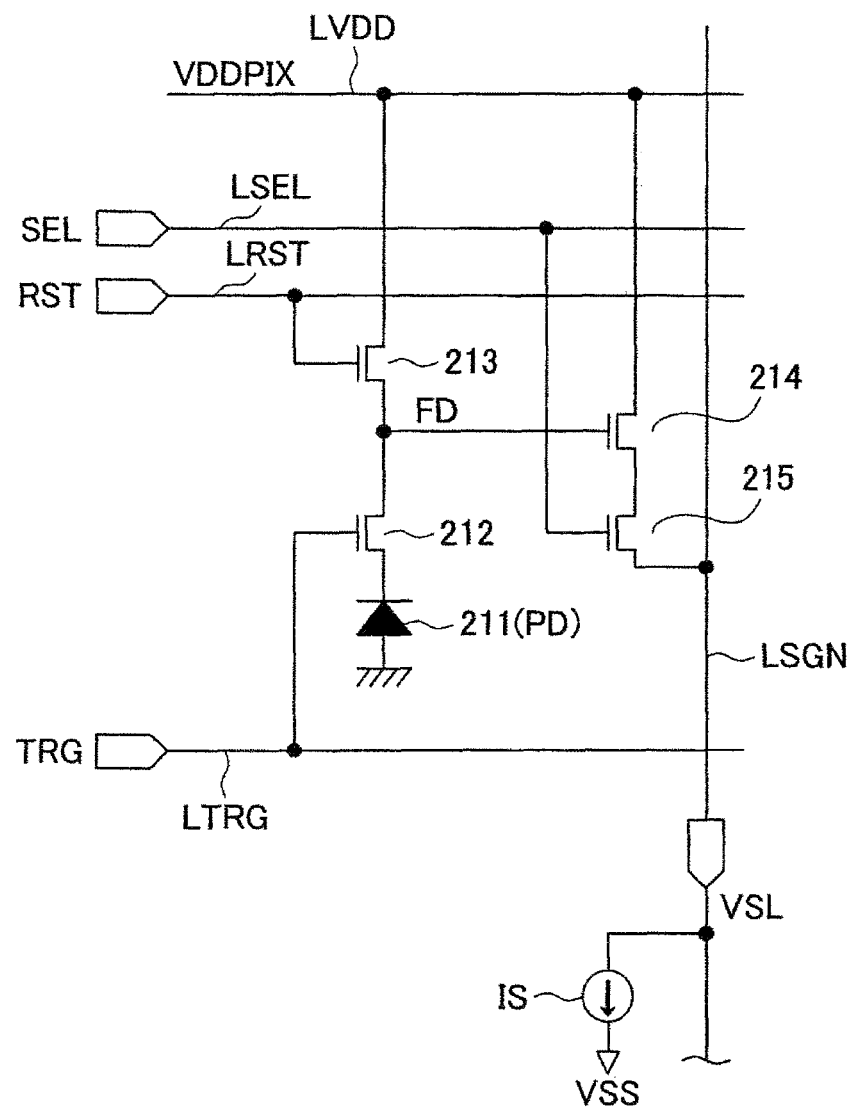
FIG. 8 is a diagram showing an example of a pixel of a CMOS image sensor composed of four transistors according to the embodiment.

FIG. 8 is a diagram showing an example of a pixel of a CMOS image sensor composed of four transistors according to the embodiment.

A pixel circuit 210A has a photoelectric conversion element (hereinafter simply may be referred to as a PD) 211 composed of, for example, a photodiode (PD).

With respect to the one photoelectric conversion element 211, the pixel circuit 210A has four transistors serving as active elements, i.e., a transfer transistor 212, a reset transistor 213, an amplification transistor 214, and a selection transistor 215.

The photoelectric conversion element 211 photoelectrically converts incident light into charges (here, electrons) of an amount corresponding to the amount of the light.

The transfer transistor 212 serving as a transfer element is connected between the photoelectric conversion element 211 and a floating diffusion FD serving as an input node. A transfer signal TRG serving as a control signal is supplied to the gate (transfer gate) of the transfer transistor 212 through a transfer control line LTRG.

Thus, the transfer transistor 212 transfers the electrons photoelectrically converted by the photoelectric conversion element 211 to the floating diffusion FD.

The reset transistor 213 is connected between a power supply line LVDD to which a power supply VDD is supplied and the floating diffusion FD. A reset signal RST serving as a control signal is supplied to the gate of the reset transistor 213 through a reset control line LRST.

Thus, the reset transistor 213 serving as a reset element resets a potential of the floating diffusion FD to that of the power supply line LVDD.

The floating diffusion FD is connected to the gate of the amplification transistor 214 serving as an amplification element. That is, the floating diffusion FD functions as the input node of the amplification transistor 214 serving as an amplification element.

The amplification transistor 214 and the selection transistor 215 are connected in series between the power supply line LVDD to which the power supply voltage VDD is supplied and a signal line LSGN.

Thus, the amplification transistor 214 is connected to the signal line LSGN through the selection transistor 215 and constitutes a source-follower circuit with a constant current source IS outside the pixels.

Then, a selection signal SEL serving as a control signal corresponding to an address signal is supplied to the gate of the selection transistor 215 through the selection control line LSEL, and the selection transistor 215 is turned on.

When the selection transistor 215 is turned on, the amplification transistor 214 amplifies the potential of the floating diffusion FD and outputs a voltage corresponding to the potential to the signal line LSGN. The voltage output from each of the pixels through the signal line LSGN is output to the column reading circuit 230.

Because the respective gates of the transfer transistor 212, the reset transistor 213, and the selection transistor 215 are, for example, connected in units of rows, these operations are simultaneously performed for each of the pixels by one row.

In the pixel array part 210, the wiring of the reset control line LRST, the transfer control line LTRG, and the selection control line LSEL is installed as a group in units of the rows of pixel arrangement.

Each of the control lines LRST, LTRG, and LSEL has M-lines.

The reset control lines LRST, the transfer control lines LTRG, and the selection control lines LSEL are driven by the row selection circuit 220.

As described above, the pixel array part 210 having such a configuration includes the signal wiring and the control wiring and is formed in the first chip 110.

Further, according to the embodiment, the constant current sources IS constituting the source-follower circuits with the amplification transistors 214 arranged in the first chip 110 are arranged in the second chip 120.

The row selection circuit 220 controls operations of the pixels arranged in any rows of the pixel array part 210. The row selection circuit 220 controls the pixels through the control lines LSEL, LRST, and LTRG.

Depending on, for example, a shutter mode switch signal, the row selection circuit 220 switches an exposure system to either a rolling shutter system where an exposure is performed for each row or a global shutter system where an exposure is simultaneously performed for all pixels, thereby performing image driving control.

The column reading circuit 230 receives the data of the rows of the pixels read and controlled by the row selection circuit 220 through the signal lines LSGN and then transfers the received data to a subsequent-stage signal processing circuit.

The column reading circuit 230 includes a CDS circuit and an ADC (Analog-to-digital Converter).

(2-2) Configuration Example of Solid-State Imaging Device Having Column-Parallel ADCs Note that the CMOS image sensor according to the embodiment is not particularly limited but may be configured as a CMOS image sensor having, for example, column-parallel AD converters (hereinafter abbreviated as ADCs).

Figure 9:
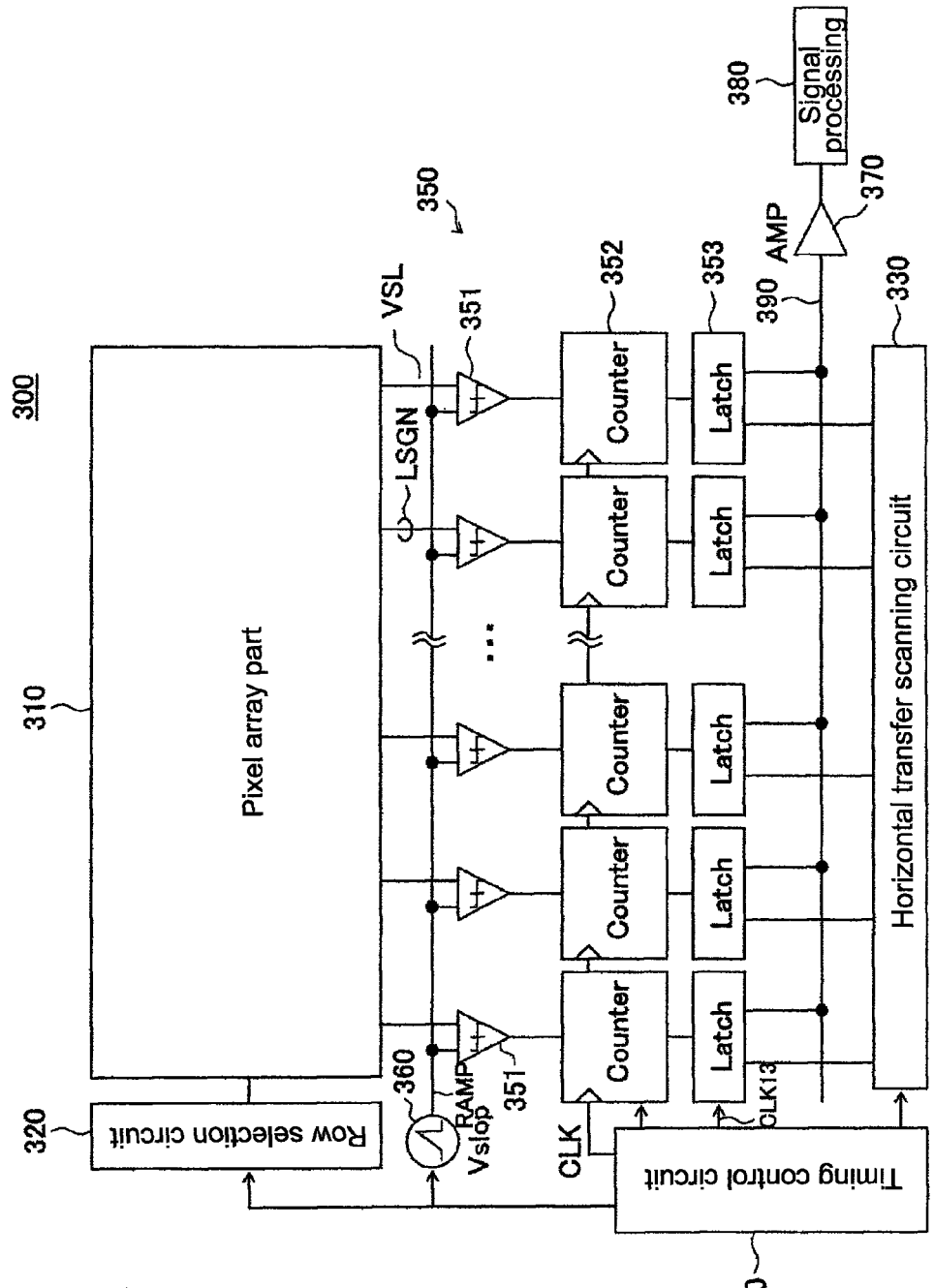
FIG. 9 is a block diagram showing a configuration example of a CMOS image sensor (solid-state imaging device) having column-parallel ADCs according to the embodiment.

FIG. 9 is a block diagram showing a configuration example of a CMOS image sensor (solid-state imaging device) having column-parallel ADCs according to the embodiment.

As shown in FIG. 9, a solid-state imaging device 300 has a pixel array part 310 serving as an imaging part, a row selection circuit 320 serving as a pixel driving part, a horizontal transfer scanning circuit 330, and a timing control circuit 340.

Moreover, the solid-state imaging device 300 has an ADC group 350, a digital-analog converter (hereinafter abbreviated as a DAC) 360 serving as a ramp signal generator, amplification circuits (S/A) 370, a signal processing circuit 380, and a horizontal transfer line 390.

The pixel array part 310 has the plurality of pixels shown in, for example, FIG. 8 arranged in matrix form, each of the pixels having a photoelectric conversion element (photodiode) and an in-pixel amplifier.

Further, the solid-state imaging device 300 has the following circuits serving as control circuits that successively read signals transferred from the pixel array part 310.

That is, the solid-state imaging device 300 has, as the control circuits, the timing control circuit 340 that generates an internal clock as a control circuit, the row selection circuit 320 that controls row addresses and row scanning, and the horizontal transfer scanning circuit 330 that controls column addresses and column scanning.

In the ADC group 350, a plurality of columns of single slope ADCs each having a comparator 351, a counter 352, and a latch 353 are arranged.

The comparator 351 compares a reference voltage Vslop having a ramp waveform (RAMP) obtained by varying a reference voltage generated by the DAC 360 in a staircase pattern with an analog signal obtained from a pixel through the vertical signal line LSGN for each row line.

The counter 352 counts the comparison time of the comparator 351.

The ADC group 350 has an n-bit digital signal conversion function and is arranged for each vertical signal line (column line) to constitute a column-parallel ADC block.

The output of the latch 353 is connected to the horizontal transfer line 390 having, for example, a 2n bit width.

Further, the 2n amplification circuits 370 and the signal processing circuit 380 corresponding to the horizontal transfer line 390 are arranged.

In the ADC group 350, the comparator 351 arranged for each column compares the analog signal (potential VSL) read to the signal line LSGN with the reference voltage Vslop (slope waveform that has a certain slope and linearly varies).

At this time, the counter 352 arranged for each column as is the case with the comparator 351 operates. The potential (analog signal) VSL of the signal line (LSGN) is converted into a digital signal in such a manner that the certain potential Vslop of the ramp waveform RAMP varies corresponding to the counter value of the counter 352.

In order to vary the reference voltage Vslop, variation in voltage is converted into variation in time, and the time is counted at a certain cycle (clock) to convert the potential into the digital value.

Then, when the analog electric signal VSL crosses the reference voltage Vslop, the output of the comparator 351 is inverted to stop the input clock of the counter 352, thereby completing the AD conversion.

After the completion of the AD conversion described above, the horizontal transfer scanning circuit 330 inputs data held by the latch 353 to the signal processing circuit 380 through the horizontal transfer line 390 and the amplification circuits 370, thereby generating a two-dimensional image.

The column-parallel output processing is thus performed.

Note that a specific configuration of the comparator 351 employed here will be described in detail below.

A CMOS image sensor 300 serving as a semiconductor device also employs the laminated structure shown in FIG. 1.

In the laminated structure according to the embodiment, the first chip 110 basically has the pixel array part 310.

The second chip 120 has the row selection circuit 320, the horizontal transfer scanning circuit 330, the timing control circuit 340, the ADC group 350, the DAC (ramp signal generator) 360, the amplification circuits (S/A) 370, the signal processing circuit 380, and the horizontal transfer line 390.

Signals for driving the pixels, analog read signals of the pixels (sensors), a power supply voltage, and the like are transferred between the first chip 110 and the second chip 120 through the TCVs formed in the first chip 110.

(2-3) First Arrangement Configuration Example in Solid-State Imaging Device

Here, a description will be given of a configuration example where the constituents of the CMOS image sensor having the column-parallel ADCs shown in FIG. 9 are arranged in a first chip and a second chip of a laminated structure.

Figure 10:
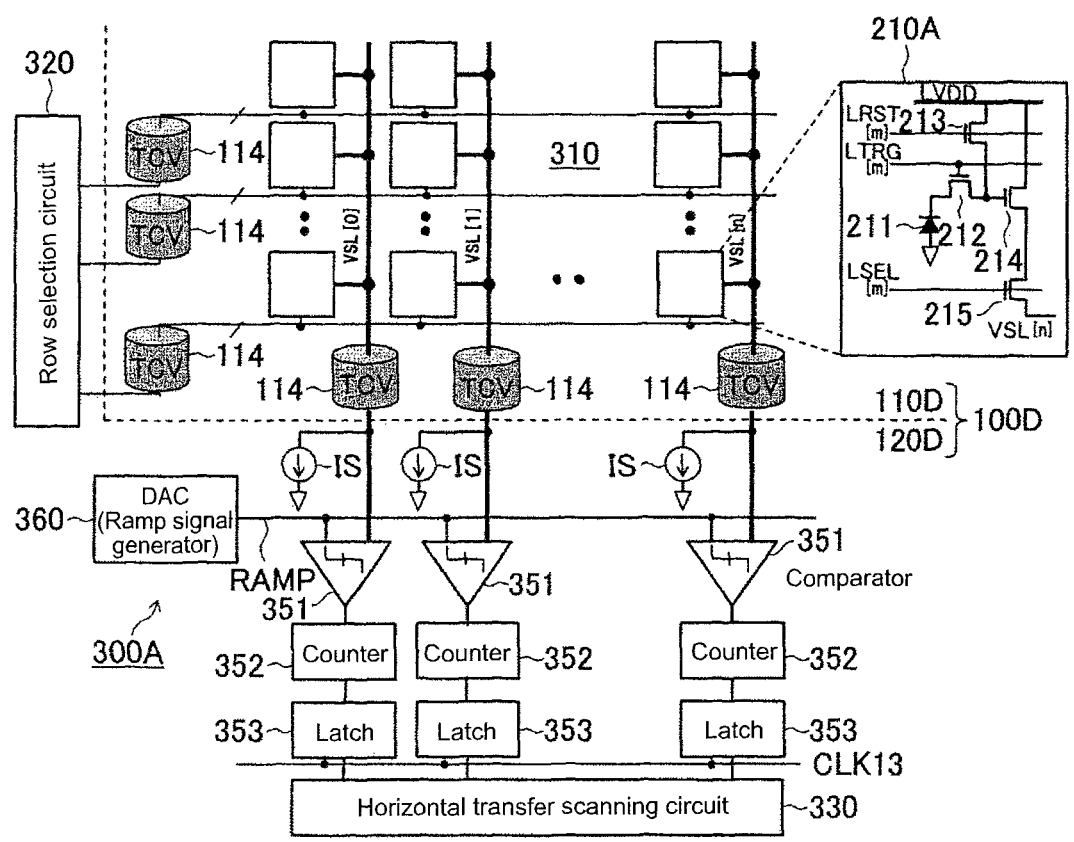
FIG. 10 is a diagram showing a first arrangement configuration example of the circuits or the like in a CMOS image sensor having column-parallel ADCs according to the embodiment.

FIG. 10 is a diagram showing a first arrangement configuration example of the circuits or the like in a CMOS image sensor having column-parallel ADCs according to the embodiment.

Also in FIG. 10, a first chip 110D and a second chip 120A are two-dimensionally developed to facilitate the understanding of the arrangement of the circuits or the like such as the first chip 110D and the second chip 120D of the laminated structure.

Further, in FIG. 10, the timing control circuit 340, the amplification circuits 370, and the signal processing circuit 380 are omitted. The second chip 210D also has these circuits.

As described above, in the laminated structure, the first chip 110D basically has the pixel array part 310.

The second chip 120D has the row selection circuit 320, the horizontal transfer scanning circuit 330, the timing control circuit 340, the comparators 351 of the ADC group 350, the counters 352, the latches 353, and the DAC (ramp signal generator) 360.

Signals for driving the pixels, analog read signals of the pixels (sensors), a power supply voltage, and the like are transferred between the first chip 110D and the second chip 120D through the TCVs 114 formed in the first chip 110D.

Note that according to the embodiment, the current sources IS constituting the source-follower circuits with the amplification transistors or the like of the pixels arranged in the first chip 110D are arranged in the second chip 120D.

The arrangement of the constituents shown in FIG. 10 is performed in the same manner as that shown in FIG. 5.

In the CMOS image sensor 300A shown in FIG. 10, the transfer control signal TRG, which is output from the column selection circuit 320 and used for controlling the on/off of the transfer transistors (transfer switches), has the same function as that of the first clock CLK11 shown in FIG. 5.

The timing for generating the ramp waves is controlled to substantially stabilize the analog signal VSL(m), thereby making it possible to transmit the signals while reducing the error caused by the interference from the adjacent TCVs as shown in FIG. 6.

Figure 11:
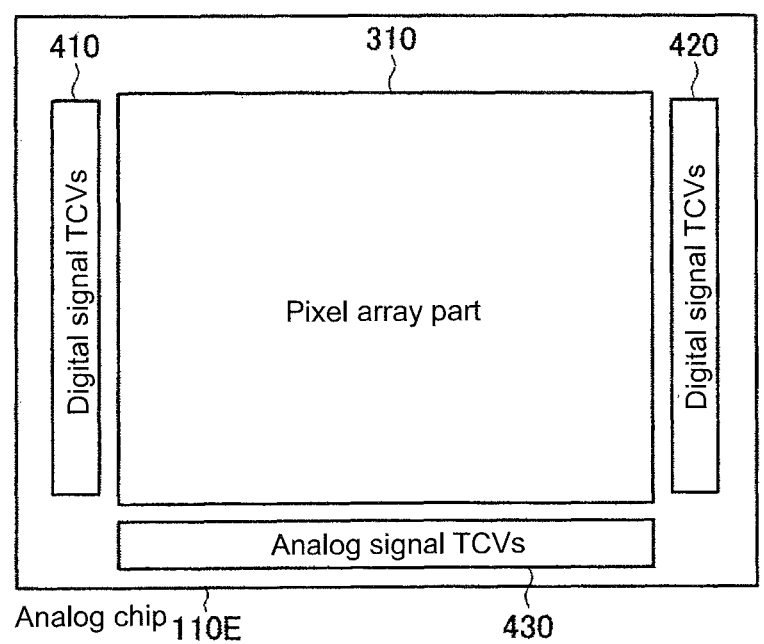
FIG. 11 is a diagram showing an example where TCVs for transmitting discrete-time analog signals are concentrated and separated from TCVs for transmitting digital signals.

FIG. 11 is a diagram showing an example where the TCVs for transmitting the discrete-time analog signals are concentrated and separated from the TCVs for transmitting the digital signals.

This configuration can reduce the interference from the adjacent TCVs.

However, in the system shown in FIG. 10 for example, the row selection circuit 320 outputs normal digital signals for turning on/off the switches. Therefore, it is not easy to reduce the interference with the signal lines LSGN(n) based on these signals.

According to the embodiment of the present disclosure, as shown in FIG. 11, it is effective to concentrate the TCVs for transmitting the discrete-time analog signals and separate such TCVs from the TCVs for transmitting the digital signals.

In an example shown in FIG. 11, a first chip 110E has regions 410 and 420 where the TCVs for transmitting the digital signals are arranged on both right and left sides of the pixel array part 310.

Further, in FIG. 11, the first chip 110E has a region 430 where the TCVs for transmitting the analog signals are arranged on the lower side of the pixel array part 310.

(2-4) Second Arrangement Configuration Example in Solid-State Imaging Device

Figure 12:
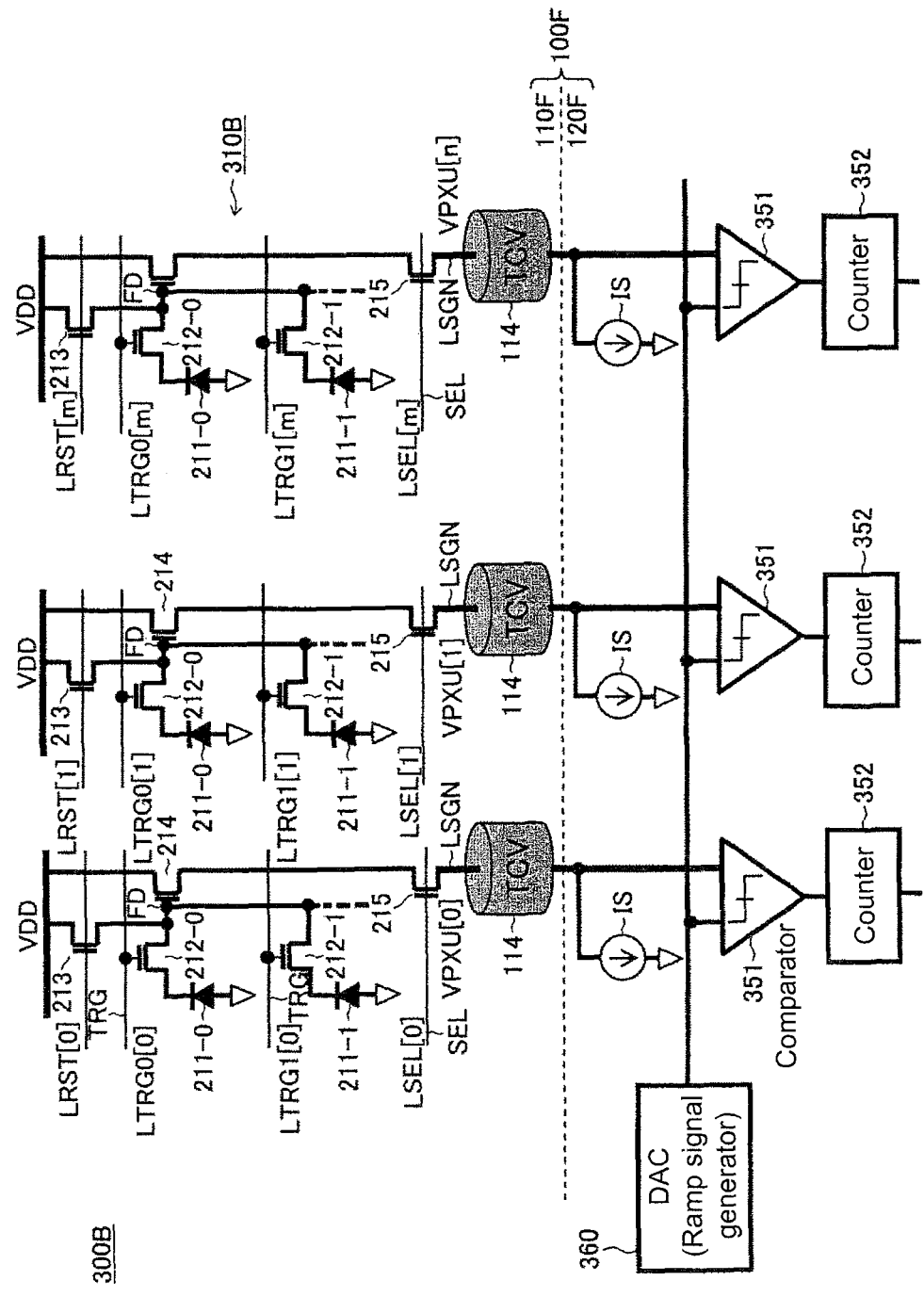
FIG. 12 is a diagram showing a second arrangement configuration example of the circuits or the like in a CMOS image sensor having column-parallel ADCs according to the embodiment.

FIG. 12 is a diagram showing a second arrangement configuration example of the circuits or the like in a CMOS image sensor having column-parallel ADCs according to the embodiment.

A CMOS image sensor 300B shown in FIG. 12 shows a case where one floating diffusion FD is shared by a plurality of pixels in a pixel array part 310B.

In the example shown in FIG. 12, the floating diffusion FD, the reset transistor 213, the amplification transistor 214, and the selection transistor 215 are shared by two pixels.

Each of the pixels includes the photoelectric conversion element (photodiode) 211 and the transfer transistor 212.

Also in this case, a first chip 110F basically has the pixel array part 310B, and other configurations of the CMOS image sensor 300B are the same as those of the CMOS image sensor 300A shown in FIG. 10.

(2-5) Third Arrangement Configuration Example in Solid-State Imaging Device

Figure 13:
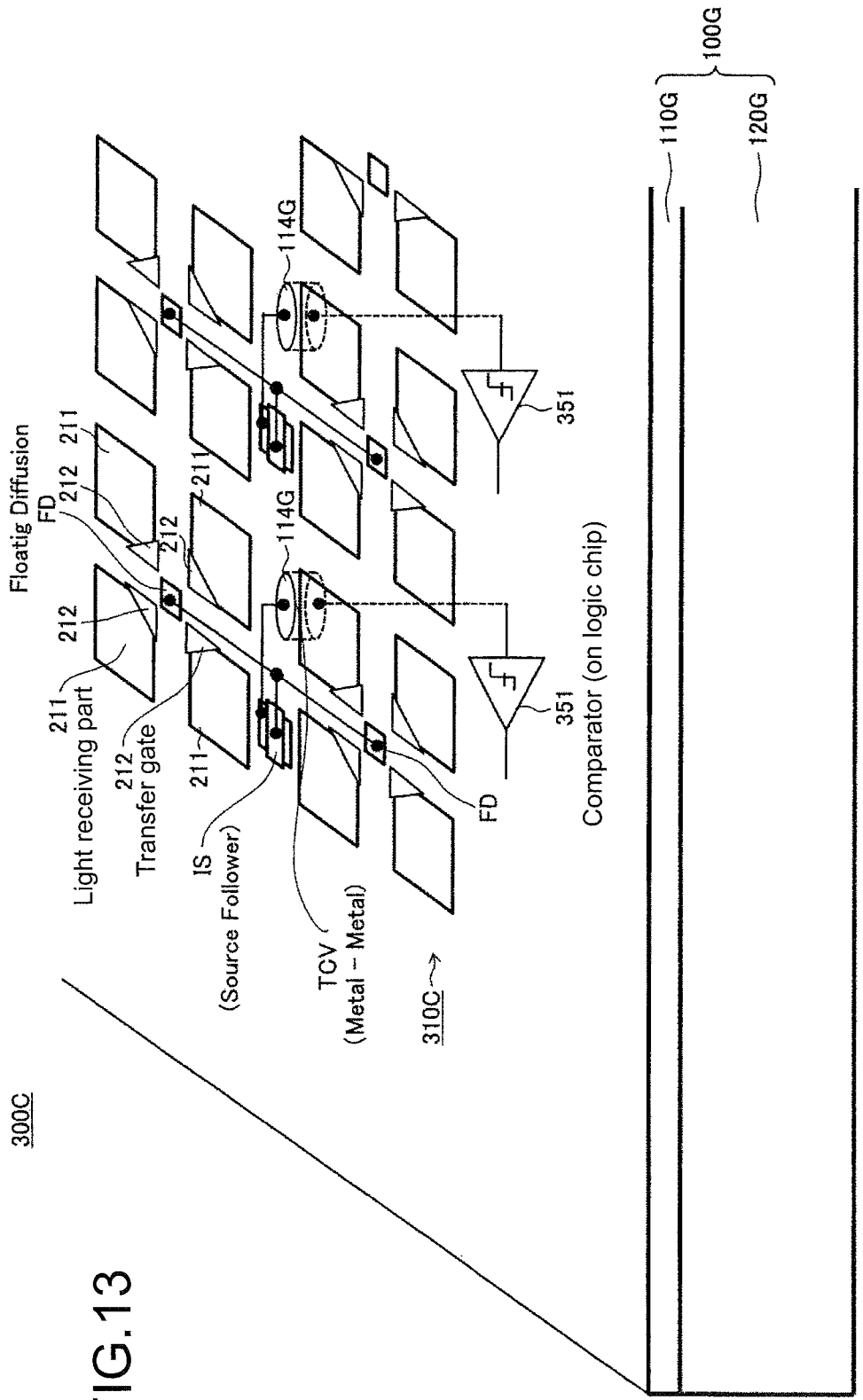
FIG. 13 is a diagram showing a third arrangement configuration example of the circuits or the like in a CMOS image sensor having column-parallel ADCs according to the embodiment.

FIG. 13 is a diagram showing a third arrangement configuration example of the circuits or the like in a CMOS image sensor having column-parallel ADCs according to the embodiment.

As in the case of the CMOS image sensor 300B shown in FIG. 12, a CMOS image sensor 300C shown in FIG. 13 shows a case where one floating diffusion FD is shared by a plurality of pixels in a pixel array part 310C.

Also in this case, a first chip 110G basically has the pixel array part 310C.

In this example, TCVs 114G are formed near shared regions.

The TCVs 114G are formed in such a manner that the connection electrodes made of metal (for example, Cu) formed in the first chip 110G and a second chip 120G are connected to each other by metal. The pixel signals output to the signal lines LSGN are supplied to the comparators 351 of the second chip 120G through the TCVs 114G.

(3) Configuration Example of Comparator

Next, a description will be given of a specific configuration example of the comparator 351 applied to the ADC group and forming the column ADC.

First, the comparator 351 according to the embodiment reduces a change in an input impedance, thereby making it possible to reduce an error in an input signal and improve a streaking phenomenon.

Second, the comparator 351 according to the embodiment reduces fluctuations in the current value of a current source circuit, thereby making it possible to reduce fluctuations in a power supply voltage, reduce an error in a comparison result, and reduce an error caused by interference with other circuits in an apparatus system including the comparator.

With the second configuration, it is also possible to improve the streaking phenomenon.

Further, the comparator according to the embodiment of the present disclosure may have a third configuration where the first and second configurations are combined together.

In performing the embodiment of the present disclosure described above, there is a concern that the noise of the quantizers and the comparators arranged in the second chip serving as a digital chip becomes larger than that of the quantizers and the comparators arranged in an analog chip.

The comparators according to the embodiment include a configuration effective for the noise.

Hereinafter, a description will be given of configuration examples of the comparators in the CMOS image sensors shown in FIGS. 9 to 13.

In the following description, the comparator will be denoted by symbol 500.

(3-1) Basic Concept of First Configuration Example of Comparator

Figure 14:
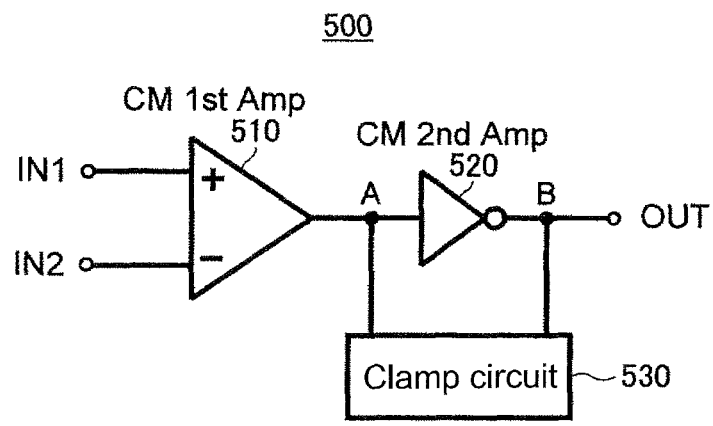
FIG. 14 is a circuit diagram showing a first configuration example of a comparator according to the embodiment.

FIG. 14 is a diagram showing a basic concept of a first configuration example of the comparator according to the embodiment.

Figure 15:
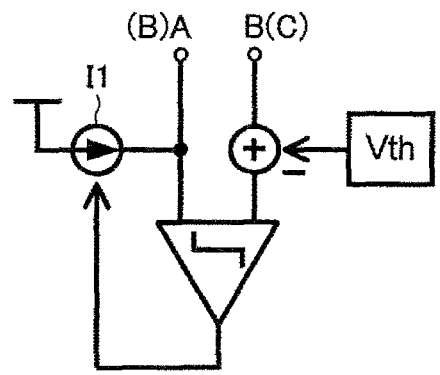
FIG. 15 is a diagram for explaining a basic concept of clamping.

FIG. 15 is a diagram for explaining a basic concept of clamping.

A comparator 500 of the first configuration example basically has a first amplifier 510, a second amplifier 520, and a clamp circuit 530 serving as a level holding part, the first amplifier 510 and the second amplifier 520 being cascade-connected to each other.

That is, the comparator 500 has a two-stage amplifier configuration and also includes the clamp circuit 530 connected to a first output node A of the first amplifier 510 on a first stage and a second output node B of the second amplifier 520 on a second stage.

As shown in FIG. 15, the clamp circuit 530 detects voltages of the output nodes A and B and turns on a current source 11 to feed a current from a power supply (ground) to the output node A (or feed the current out from the output node A) after detecting that the output node B has become higher (or has become lower) than the output node A by a constant voltage Vth.

Thus, the clamp circuit 530 prevents a further change in the potentials of the nodes A and B.

Figure 16A:
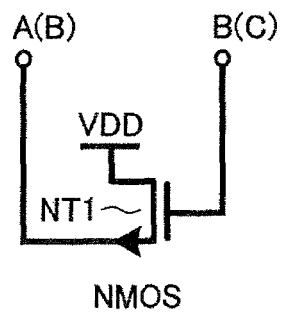
FIGS. 16A and 16B are diagrams each showing the simplest configuration example of a clamp circuit.
Figure 16B:
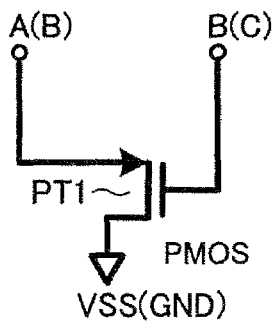

FIGS. 16A and 16B are diagrams each showing the simplest configuration example of a clamp circuit.

As shown in FIGS. 16A and 16B, the clamp circuit 530 described above can be composed of an n-channel MOS (NMOS) transistor NT1 or a p-channel MOS (PMOS) transistor PT1 in the simplest way.

In a case where the clamp circuit 530 is composed of the NMOS transistor NT1, the clamp circuit 530 feeds the current from the power supply to the output node A after detecting that the output node B has becomes higher than the output node A by a threshold voltage Vthn of the MOS.

Thus, the clamp circuit 530 prevents a further reduction in the potential of the output node A and clamps the potentials of the nodes A and B.

In a case where the clamp circuit 530 is composed of the PMOS transistor PT1, the clamp circuit 530 extracts the current from the output node A to the ground GND after detecting that the output node B has become lower than the output node A by a threshold voltage |Vthp| of the MOS.

Thus, the clamp circuit 530 prevents a further increase in the potential of the output node A and clamps the potentials of the nodes A and B.

(3-2) Specific Circuit of First Configuration Example of Comparator

Figure 17:
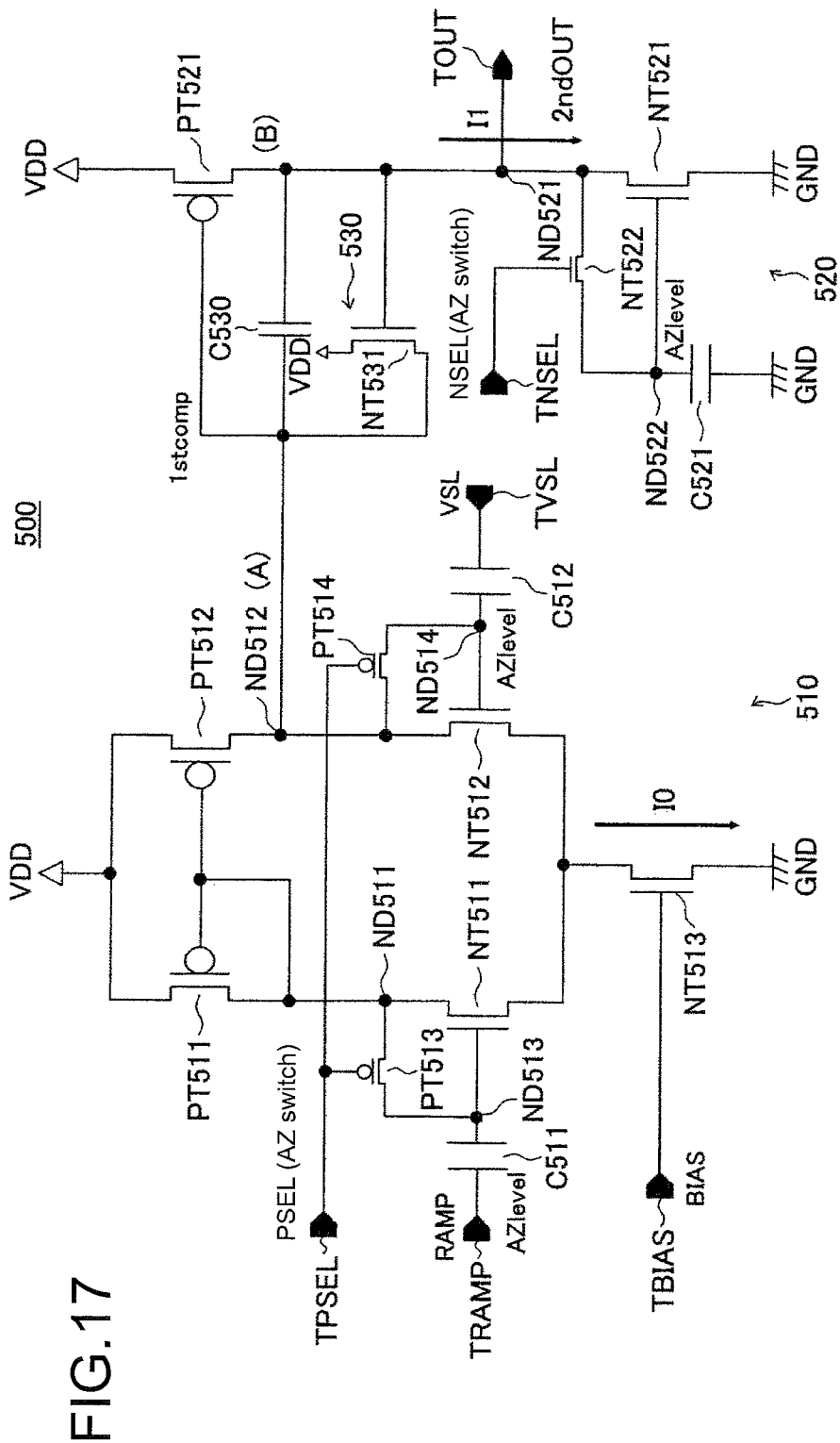
FIG. 17 is a circuit diagram showing the first configuration example of the comparator according to the embodiment.

FIG. 17 is a circuit diagram showing a first configuration example of the comparator according to the embodiment.

FIG. 17 shows a configuration example of the comparator that greatly restricts a band using a mirror capacitance to reduce noise. With such a configuration, the comparator is caused to output a small noise power. Therefore, it is possible to compensate for a disadvantage caused when the comparator is arranged in the second chip serving as a digital chip.

As shown in FIG. 17, the comparator 500 arranged for each column has the first amplifier 510, the second amplifier 520, the clamp circuit 530, and a capacitor C530 serving as a capacitance for presenting a mirror effect, the first amplifier 510 and the second amplifier 520 being cascade-connected to each other.

Further, a capacitance is connected between the input and the output of the source grounded amplifier of the second amplifier 520 on the second stage. The capacitance presents a mirror effect and is thus equivalent to a gain-multiplied capacitance connected to a source grounded input.

Thus, the band of the comparator 500 is greatly narrowed with a small capacitance.

In order to determine an operating point for every column at starting a row operation, the comparator 500 has an initializing (auto zero: AZ) and sampling function.

Note that according to the embodiment, a first conductive type is either a p-channel or an n-channel, and a second conductive type is either the n-channel or the p-channel.

The first amplifier 510 has PMOS transistors PT511 to PT514 and NMOS transistors NT511 to NT513 as insulation gate type field effect transistors.

The first amplifier 510 has first and second capacitors C511 and C512 as sampling capacitances (input capacitances) of an AZ level.

The source of the PMOS transistor PT511 and the source of the PMOS transistor PT512 are connected to the power supply potential source VDD.

The drain of the PMOS transistor PT511 is connected to the drain of the NMOS transistor NT511, and a node ND511 is formed at the connection point between the drain of the PMOS transistor PT511 and the drain of the NMOS transistor NT511. Further, the drain and the gate of the PMOS transistor PT511 are connected to each other, and the connection point between the drain and the gate of the PMOS transistor PT511 is connected to the gate of the PMOS transistor 512.

The drain of the PMOS transistor PT512 is connected to the drain of the NMOS transistor NT512, and an output node ND512 is formed at the connection point between the drain of the PMOS transistor PT512 and the drain of the NMOS transistor NT512.

The source of the NMOS transistor NT511 and the source of the NMOS transistor NT512 are connected to each other, and the connection point between the source of the NMOS transistor NT511 and the source of the NMOS transistor NT512 is connected to the drain of the NMOS transistor NT513. The source of the NMOS transistor NT513 is connected to a reference potential source (for example, ground potential) GND.

The gate of the NMOS transistor NT511 is connected to a first electrode of the capacitor C511, and a node ND513 is formed at the connection point between the gate of the NMOS transistor NT511 and the first electrode of the capacitor C511. Further, a second electrode of the capacitor C511 is connected to an input terminal TRAMP of the ramp signal RAMP.

The gate of the NMOS transistor NT512 is connected to a first electrode of the capacitor C512, and a node ND514 is formed at the connection point between the gate of the NMOS transistor NT512 and the first electrode of the capacitor C512. Further, a second electrode of the capacitor C512 is connected to an input terminal TVSL of the analog signal VSL.

Furthermore, the gate of the NMOS transistor NT513 is connected to an input terminal TBIAS of a bias signal BIAS.

The source of the PMOS transistor PT513 is connected to the node ND511, and the drain thereof is connected to the node ND513. The source of the PMOS transistor PT514 is connected to the output node ND512, and the drain thereof is connected to the node ND514.

Further, the gates of the PMOS transistors PT513 and PT514 are commonly connected to an input terminal TPSEL of a low-level and active first AZ signal PSEL.

In the first amplifier 510 having such a configuration, the PMOS transistors PT511 and PT512 constitute a current mirror circuit.

Further, the NMOS transistors NT511 and NT512 constitute a differential comparison part (transconductance amplifier (Gm amplifier)) 511 that uses the NMOS transistor NT513 as a power supply source.

Further, the PMOS transistors PT513 and PT514 function as AZ (auto-zero: initialization) switches, and the capacitors C511 and C512 function as sampling capacitances of an AZ level.

Then, an output signal 1st comp of the first amplifier 510 is output from the output node ND512 to the second amplifier 520.

The second amplifier 520 has a PMOS transistor PT521, NMOS transistors NT521 and NT522, and a third capacitor C521 serving as a sampling capacitance of an AZ level.

The source of the PMOS transistor PT521 is connected to the power supply potential source VDD, and the gate thereof is connected to the output node ND512 of the first amplifier 510.

The drain of the PMOS transistor PT521 is connected to the drain of the NMOS transistor NT521, and an output node ND521 is formed at the connection point between the drain of the PMOS transistor PT521 and the drain of the NMOS transistor NT521.

The source of the NMOS transistor NT521 is connected to the ground potential GND, and the gate thereof is connected to a first electrode of the capacitor C521. A node ND522 is formed at the connection point between the source of the NMOS transistor NT521 and the first electrode of the capacitor C521. A second electrode of the capacitor C521 is connected to the ground potential GND.

The drain of the NMOS transistor NT522 is connected to the node ND521, and the source thereof is connected to the node ND522.

Further, the gate of the NMOS transistor NT522 is connected to an input terminal TNSEL of a high-level and active second AZ signal NSEL.

The second AZ signal NSEL has a level complementary to that of the first AZ signal PSEL supplied to the first amplifier 510.

In the second amplifier 520 having such a configuration, the PMOS transistor PT521 constitutes an input and amplification circuit.

Further, the NMOS transistor NT522 functions as an AZ switch, and the capacitor C521 functions as a sampling capacitance of an AZ level.

Further, the output node ND521 of the second amplifier 520 is connected to an output terminal TOUT of the comparator 500.

The clamp circuit 530 has an NMOS transistor NT531. That is, the clamp circuit 530 employs the configuration shown in FIG. 16A.

The drain of the NMOS transistor NT531 is connected to the power supply voltage source VDD, the source thereof is connected to the output node ND512 (node A) of the first amplifier 510, and the gate thereof is connected to the output node ND521 of the second amplifier 520.

A first electrode of the capacitor C530 is connected to the gate (input) of the PMOS transistor PT521 as a source grounded amplifier, and a second electrode thereof is connected to the drain (output) of the PMOS transistor PT521.

The capacitor C530 presents a mirror effect and is thus equivalent to a gain-multiplied capacitance connected to a source grounded input.

Assuming that the gain of the PMOS transistor PT521 is $A_{V2}$ and the capacitance of the capacitor C530 is C, the capacitance of the output of the first amplifier 510 is gain-multiplied like $\{C \times (1+A_{V2})\}$. Therefore, the capacitance value of the capacitor C530 may be small.

Thus, the band of the comparator 500 is greatly narrowed with a small capacitance.

As described above, the clamp circuit 530 is connected between the output node ND512 (A) of the first amplifier 510 and the output node ND521 (B) of the second amplifier 520 in the comparator 500.

The clamp circuit 530 detects a voltage of the output node ND512 (A) of the first amplifier 510 and that of the output node ND521 (B) of the second amplifier 520.

In this case, the clamp circuit 530 detects that the output node ND521 (B) of the second amplifier 520 has become higher than the output node ND512 (A) of the first amplifier 510 by a constant voltage Vth.

Specifically, in a case where the output node ND521 (B) of the second amplifier 520 is higher than the output node ND512 (A) of the first amplifier 510 by the constant voltage Vth, the clamp circuit 530 turns on the NMOS transistor NT531 to feed a current from the power supply to the output node ND512 (A).

In this case, the NMOS transistor NT513 of the first amplifier 510 functions as a current source.

Then, the clamp circuit 530 performs clamp processing such that the potential of the output node ND512 (A) of the first amplifier 510 does not become lower than the threshold voltage Vthn of the NMOS transistor NT512 forming a differential-pair transistor whose drain is connected to the output node ND512.

In other words, the clamp circuit 530 clamps the potential of the output node ND512 (A) such that the differential-pair transistor NT512 (M2) satisfies and maintains its saturated operation condition.

Thus, the clamp circuit 530 prevents the potential of the output node ND512 (A) from being lower than the constant potential and clamps the potentials of the nodes ND512 (A) and ND512 (B).

With the function of the clamp circuit 530 described above, it is possible to achieve an improvement in a streaking phenomenon.

Next, a description will be given of a reason why a streaking phenomenon can be improved.

Figure 18:
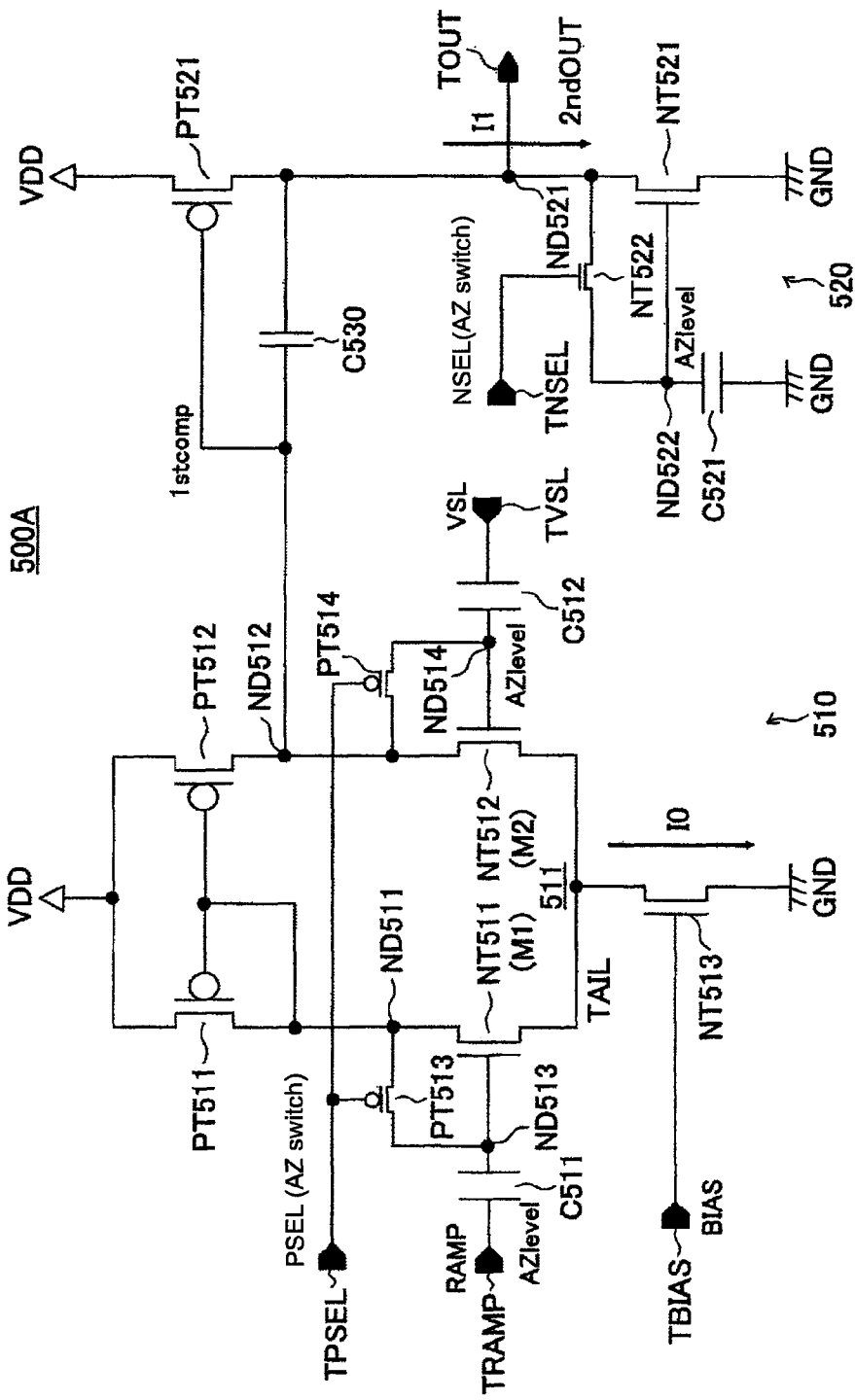
FIG. 18 is a circuit diagram showing a comparator having no clamp circuit as an example compared with the comparator shown in FIG. 17.

Prior to the description, a description will be first given of a reason why a streaking phenomenon occurs using a comparator shown in FIG. 18 having no clamp circuit as a comparison example.

(Reason why Streaking Phenomenon Occurs)

First, a description will be given of the reason why a streaking phenomenon occurs, i.e., a reason for an error transmitted from a comparator 500A to a ramp (a change in an input impedance of the comparator). Note that a solution itself to a mechanism as will be described below is novel, and thus an effect presented by the embodiment of the present disclosure is theoretically grounded on the novel solution to the mechanism.

FIG. 18 is a circuit diagram showing a comparator having no clamp circuit as an example compared with the comparator shown in FIG. 17.

Figure 19A:
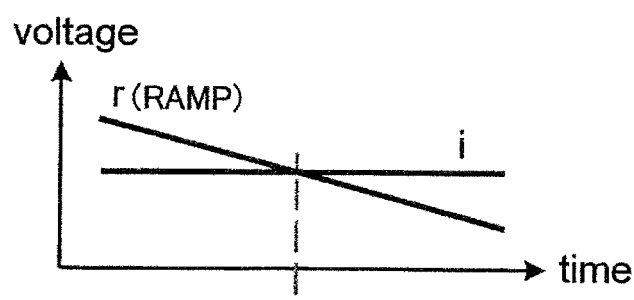
FIGS. 19A and 19B are diagrams showing operation waveforms of the comparator shown in FIG. 18.
Figure 19B:
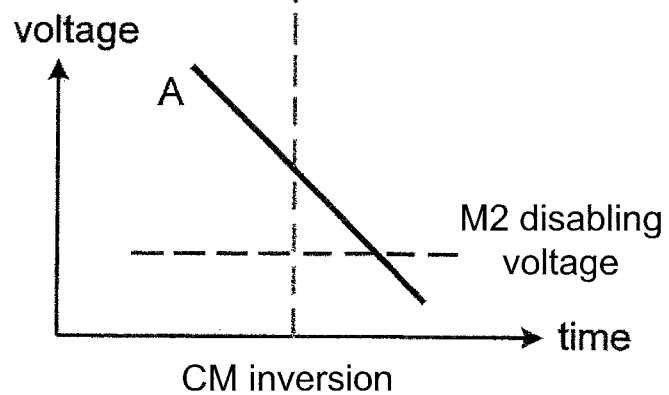

FIGS. 19A and 19B are diagrams showing operation waveforms of the comparator shown in FIG. 18.

FIGS. 20A to 20C are diagrams, respectively, showing a parasitic capacitance of the comparator shown in FIG. 18, an operation waveform of the comparator, and a change in an equivalent capacitance at the operation of the comparator. FIG. 20A shows the parasitic capacitance, FIG. 20B shows the operation waveform both in a differential-pair state and in a source-follower state, and FIG. 20C shows the change in the equivalent capacitance at the operation of the comparator.

Figure 21:
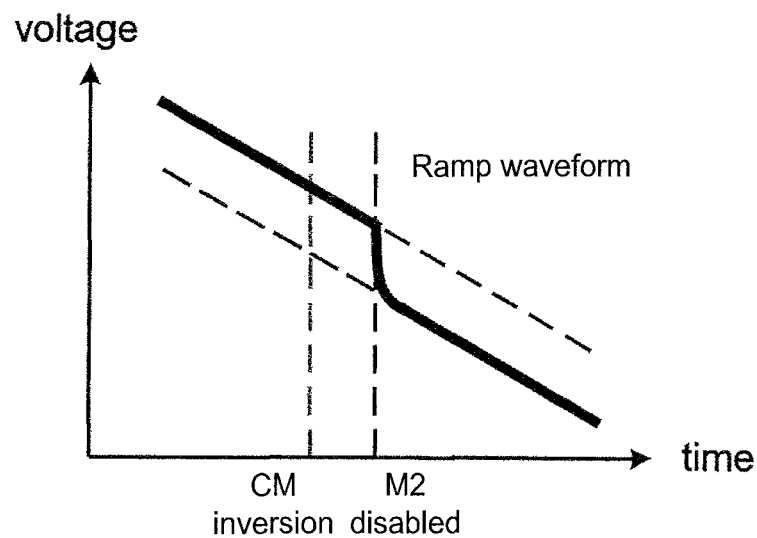
FIG. 21 is a diagram showing a ramp waveform at the operation of the comparator shown in FIG. 18.

FIG. 21 is a diagram showing a ramp waveform at the operation of the comparator shown in FIG. 18.

When the ramp waveform RAMP is input to the comparator 500A, the first amplifier 510 constituting the comparator operates.

Accordingly, as shown in FIGS. 19A and 19B, the output node ND512 (A) of the first amplifier 510 on the first stage presents the ramp waveform having a slope sharper than the input ramp waveform RAMP by an amount corresponding to an amplification gain of the first amplifier 510.

Because the input ramp waveform RAMP continues after the inversion of the output of the first amplifier 510, a potential of the output node ND512 (A) continues to decrease. Then, a drain voltage of the NMOS transistor NT512 (M2) continues to decrease.

Thus, the NMOS transistor NT512 (M2) does not satisfy its saturated operation condition and gets in a triode operation state. As a result, the driving force of the NMOS transistor NT512 (M2) greatly reduces.

When the differential-pair transistors NT511 (M1) and NT512 (M2) both satisfy the saturated operation condition, i.e., when they are in a normal differential-pair state, a potential of a node TAIL shows a ramp waveform having a slope half the slope of the ramp waveform.

On the other hand, when the NMOS transistor NT512 (M2) does not satisfy the saturated condition and loses its driving force, the differential-pair circuit becomes equivalent to a source-follower circuit composed of the NMOS transistor NT511 (M1) and the NMOS transistor NT513 serving as the current source.

Because the node TAIL is the output node of the source-follower circuit, the potential of the node TAIL at this time shows a ramp waveform having the same slope as that of the ramp waveform as shown in FIG. 20B.

In the first amplifier 510 of the comparator 500A, a parasitic capacitance Cgs exists between the gate and the source of the differential-pair transistor M1 (NT511).

By a miller effect, an equivalent capacitance by the capacitance as seen from the input side of the ramp waveform becomes 0.5 Cgs, as shown in FIG. 20C, in the differential-pair state where the node TAIL shows a ramp waveform having the slope half the slope of the ramp waveform. Further, the equivalent capacitance becomes 0 Cgs in the source-follower state where the node TAIL shows a ramp waveform having the same slope as that of the ramp waveform.

That is, when the NMOS transistor NT512 (M2) is disabled (does not satisfy the saturated operation condition), the equivalent capacitance as seen from the input side of the ramp waveform decreases.

When the equivalent capacitance of the node of the ramp waveform decreases, a time constant of the node of the ramp waveform formed by an output impedance of a ramp generator and an equivalent capacitance thereof decreases.

As a result, the slope of the ramp waveform itself is constant, but its temporal transmission delay becomes small. In the ramp waveform, the small transmission delay at a certain timing is equivalent to a state where the waveform after the timing undergoes a voltage level shift as shown in FIG. 21.

Accordingly, when an output of a certain differential comparator part is inverted and the NMOS transistor NT512 (M2) is thus disabled, an influence is exerted upon a comparison part to be inverted.

More specifically, because the ramp waveform is temporarily made earlier, an inversion time of the influenced comparison part is also made earlier.

When a solid-state imaging device using single-slope AD converters has a system configuration where the brightness of a signal is, for example, expressed by the length of an inversion time, a streaking phenomenon occurs where a dark signal existing in a column causes AD conversion results of other columns to be led to a dark side.

(Improvement in Streaking Phenomenon According to Present Disclosure)

Figure 22A:
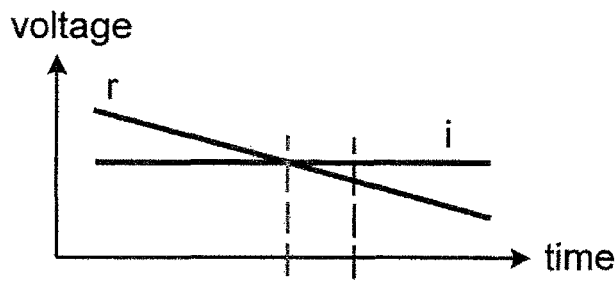
FIGS. 22A and 22B are diagrams showing operation waveforms of the comparator shown in FIG. 17.
Figure 22B:
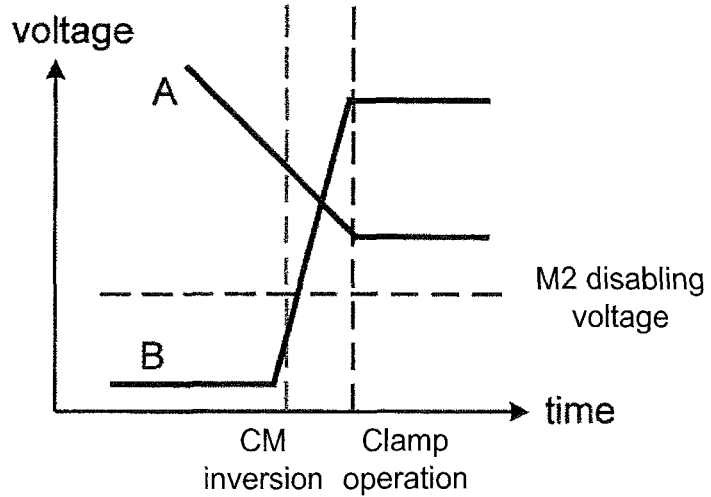

FIGS. 22A and 22B are diagrams showing operation waveforms of the comparator shown in FIG. 17.

FIGS. 23A to 23C are diagrams, respectively, showing a parasitic capacitance of the comparator shown in FIG. 17, an operation waveform of the comparator, and a change in an equivalent capacitance at the operation of the comparator. FIG. 23A shows the parasitic capacitance, FIG. 23B shows the operation waveform both in a differential-pair state and in a source-follower state, and FIG. 23C shows the change in the equivalent capacitance at the operation of the comparator.

Figure 24:
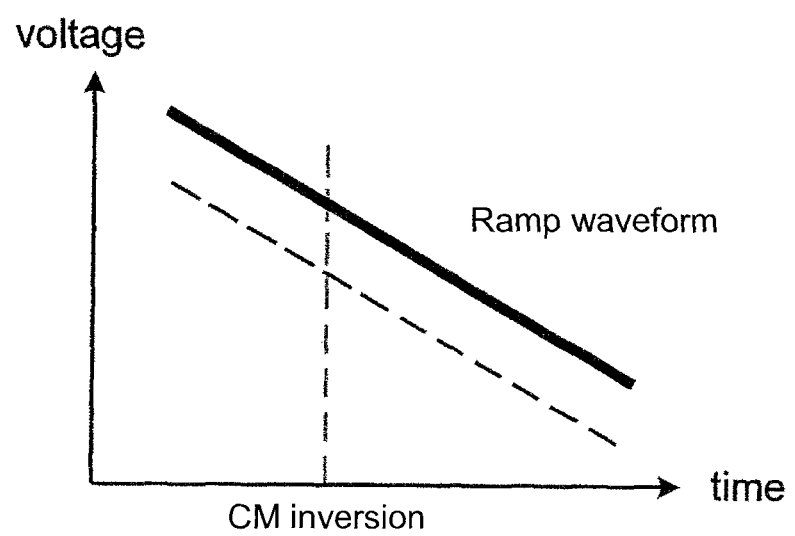
FIG. 24 is a diagram showing a ramp waveform at the operation of the comparator shown in FIG. 17.

FIG. 24 is a diagram showing a ramp waveform at the operation of the comparator shown in FIG. 17.

The comparator 500 shown in FIG. 17 clamps, after the inversion of the output of the comparison part, the potentials of the output node ND512 (A) and the output node ND512 (B) before the NMOS transistor NT512 (M2) is disabled (before the NMOS transistor NT512 (M2) does not satisfy the saturated operation condition).

As a result, as shown in FIGS. 22A and 22B, the NMOS transistor NT512 (M2) is free from its disablement (i.e., free from a state where the NMOS transistor NT512 (M2) does not satisfy the saturated operation condition).

Thus, the source-follower state does not occur. Further, as shown in FIG. 23C, and the equivalent capacitance as seen from the input side of the ramp waveform does not change after the inversion of the output of the first amplifier 510.

Accordingly, as shown in FIG. 24, a change in the time constant of the ramp waveform as described above and a level shift due to the change in the time constant of the ramp waveform do not occur.

Thus, a streaking phenomenon is greatly improved by the comparator 500 shown in FIG. 17.

(Consumption Current)

The current to be fed when the clamp circuit 530 operates is covered by a TAIL current source (the NMOS transistor NT513) for the differential-pair transistors.

That is, part of the current fed by the comparator 500A of the comparison example to reduce the potential of the output node ND512 (A) is fed to the NMOS transistor NT531 (M3).

Accordingly, an increase in the consumption current is prevented.

(Noise and Comparator Delay)

As shown in FIGS. 22A and 22B, the clamp circuit 530 starts its operation after the inversion of the output of the first amplifier 51 but does not operate at all before the inversion of the output of the first amplifier 510.

Accordingly, the clamp circuit 530 exerts no influence upon an inversion timing of the comparator 500.

As a result, the clamp circuit 530 according to the embodiment does not increase the noise of the comparator 500 and does not increase a delay time until the output of the first amplifier 510 is inverted.

(3-3) Modification of First Configuration Example of Comparator

Figure 25:
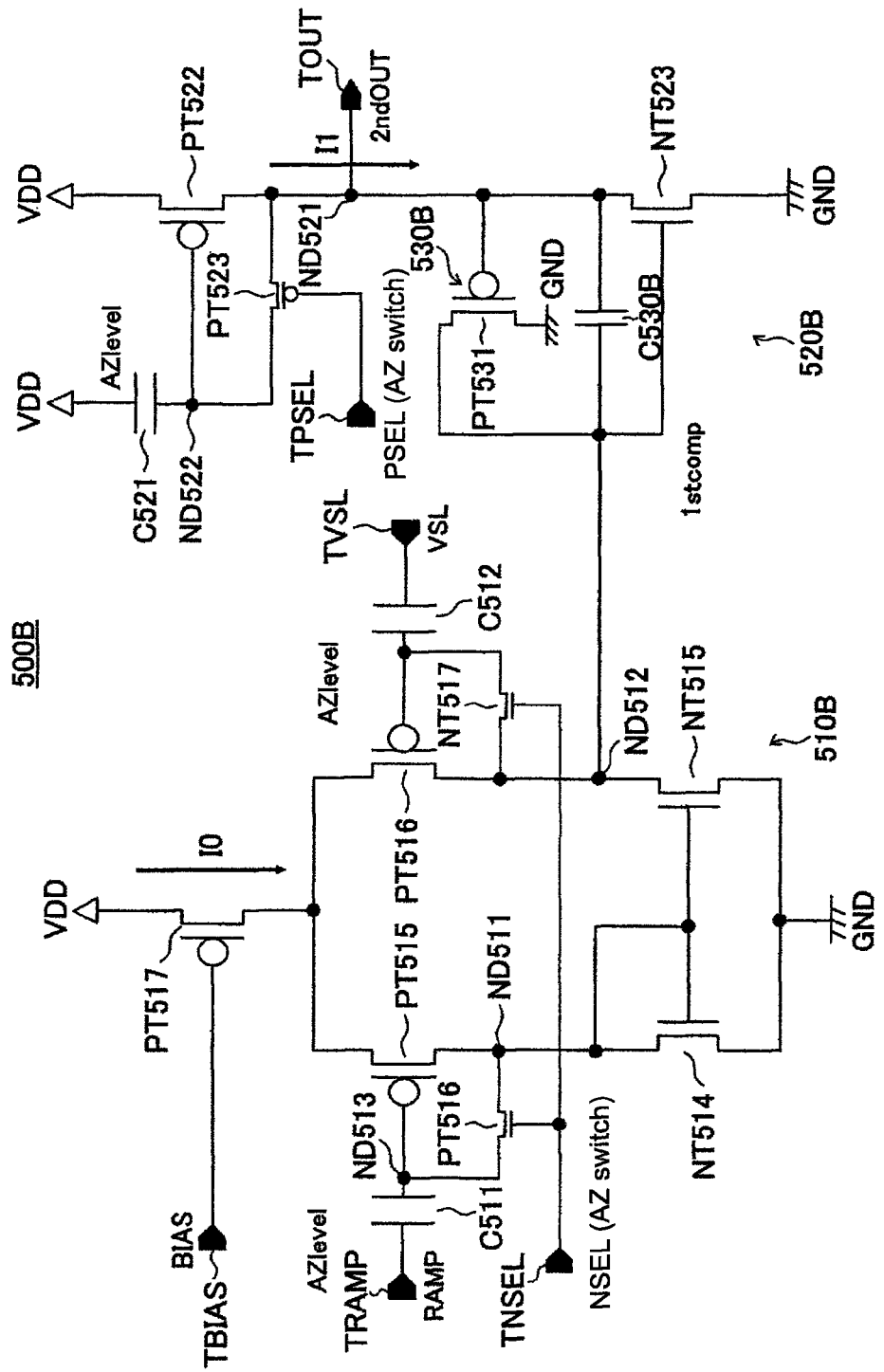
FIG. 25 is a circuit diagram showing a modification of the first configuration example of the comparator according to the embodiment.

FIG. 25 is a circuit diagram showing a modification of the first configuration example of the comparator according to the embodiment.

A comparator 500B shown in FIG. 25 has a polarity opposite to that of the transistors of the comparator 500 shown in FIG. 17. Therefore, the power supply potential and the ground potential connected to the comparator 500B are also oppositely arranged on the circuit.

Note that in FIG. 25, the nodes and the capacitors are denoted by the same symbols as those of FIG. 17 to facilitate the understanding of the arrangement of the circuit.

In a first amplifier 510B, PMOS transistors PT515 to PT517 constitute the differential comparison part and the current source instead of the NMOS transistors NT511 to NT513 shown in FIG. 17. Further, the source of the PMOS transistor PT517 serving as the current source is connected to the power supply voltage source VDD.

Further, NMOS transistors NT514 and NT515 constitute the current mirror circuit instead of the PMOS transistors PT511 and PT512 shown in FIG. 17, and the sources of the NMOS transistors NT514 and NT515 are connected to the ground potential GND.

Furthermore, NMOS transistors NT516 and NT517 constitute the AZ switch instead of the PMOS transistors PT513 and PT514 shown in FIG. 17. In this case, a second AZ signal NSEL is supplied to the gates of the NMOS transistors NT516 and NT517 in the first amplifier 510B.

In a second amplifier 520B, an NMOS transistor NT523 constitutes the input and amplification circuit instead of the PMOS transistor PT521 shown in FIG. 17. The source of the NMOS transistor NT523 is connected to the ground potential GND.

A PMOS transistor PT522 constitutes a transistor forming a mirror circuit instead of the NMOS transistor NT521 shown in FIG. 17. Further, the source of the PMOS transistor PT522 is connected to the power supply potential VDD. Furthermore, a first electrode of the capacitor C521 is connected to the node ND522 connected to the gate of the PMOS transistor PT522, and a second electrode thereof is connected to the power supply voltage source VDD.

Furthermore, a PMOS transistor PT523 constitutes the AZ switch instead of the NMOS transistor NT522 shown in FIG. 17. In this case, the first AZ signal PSEL is supplied to the gate of the PMOS transistor PT523 in the second amplifier 520A.

A PMOS transistor PT531 constitutes a clamp circuit 530B instead of the NMOS transistor NT531 shown in FIG. 17. In this case, the drain of the PMOS transistor PT531 is connected to the ground potential GND serving as a reference potential.

A first electrode of the capacitor C530B is connected to the gate (input) of the NMOS transistor NT523 as a source grounded amplifier, and a second electrode thereof is connected to the drain (output) of the NMOS transistor NT523.

The capacitor C530B presents a mirror effect and is thus equivalent to a gain-multiplied capacitance connected to a source grounded input.

Assuming that the gain of the NMOS transistor NT523 is $A_{V2}$ and the capacitance of the capacitor C530B is C, the capacitance of the output of the first amplifier 510B is gain-multiplied like $\{C \times (1+A_{V2})\}$. Therefore, the capacitance value of the capacitor C530B may be small.

Thus, the band of the comparator 500B is greatly narrowed with a small capacitance.

The comparator 500B shown in FIG. 25 having such a configuration basically operates in the same manner as the comparator 500 shown in FIG. 17. However, the waveforms of RAMP, 1st comp, and 2nd Amp become opposite.

Further, the comparator 500B shown in FIG. 25 can obtain the same effect as that of the comparator 500 shown in FIG. 17.

According to the first configuration example described above, a change in an input impedance of the comparator is reduced, thereby making it possible to reduce an error in an input signal.

Further, in a single-slope AD converter using the comparator, particularly, in a plurality of parallel single-slope AD converters using a multiplicity of the comparators each having a common slope, a change in an input impedance of the comparators can be reduced, thereby making it possible to reduce an error caused by the interference between the AD converters via a slope waveform.

In a solid-state imaging device using column-parallel single-slope AD converters, a change in an input impedance of the comparators is reduced, thereby making it possible to reduce an error caused by the interference between the AD converters via a slope waveform and reduce the degradation of image quality.

Thus, according to the first configuration example, it becomes possible for the comparator to reduce an error caused in an input waveform, improve the precision of a system, and reduce an error in AD conversion and the degradation of image quality due to the interference between AD converters and the interference between columns.

(3-4) Basic Concept of Second Configuration Example of Comparator

Figure 26:
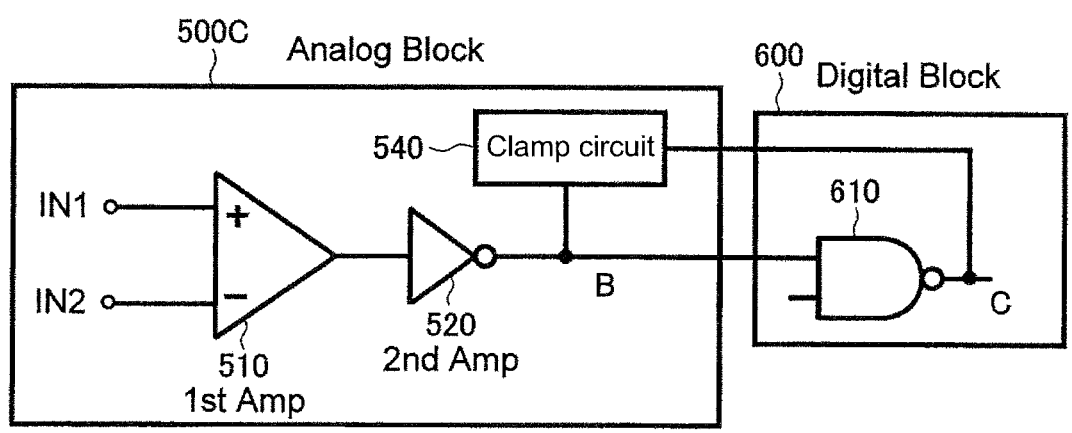
FIG. 26 is a diagram showing a basic concept of a second configuration example of a comparator according to the embodiment.

FIG. 26 is a diagram showing a basic concept of a second configuration example of a comparator according to the embodiment.

A comparator 500C of the second configuration example basically has the first amplifier 510, the second amplifier 520, and a clamp circuit 540 serving as a second level holding part, the first amplifier 510 and the second amplifier 520 being cascade-connected to each other. The output of the second amplifier 520 is connected to a logic gate 610 serving as a digital circuit 600.

Further, the clamp circuit 540 is connected to the output of the comparator 500C, i.e., a second output node B of the second amplifier 520 on the second stage and connected to a third output node C of the first-stage inversion gate of the logic gate 610.

The basic concept of the clamp circuit 540 is the same as the concept described in association with FIG. 15.

As shown in FIG. 15, the clamp circuit 540 detects voltages of the output nodes B and C and turns on the current source I1 to feed a current from the power supply (ground) to the output node B (or feed the current out from the output node B) after detecting that the output node C has become higher (or has become lower) than the output node B by the constant voltage Vth.

Thus, the clamp circuit 540 prevents a further change in the potential of the output node B.

The comparator 500C of the second configuration example can reduce noise (error) caused in its power supply. Thus, it becomes possible to improve the precision of a system and reduce an error in AD conversion and the degradation of image quality due to the interference between AD converters and between columns.

As described in association with FIG. 16, the clamp circuit 540 can be composed of the single NMOS transistor NT1 or the PMOS transistor PT1.

In a case where the clamp circuit 540 is composed of the NMOS transistor NT1, the clamp circuit 540 feeds the current from the power supply to the output node B after detecting that the output node C has become higher than the output node B by the threshold voltage Vthn of the MOS.

Thus, the clamp circuit 540 prevents a further reduction in the potential of the output node B and clamps the potentials of the nodes B and C.

In a case where the clamp circuit 540 is composed of the PMOS transistor PT1, the clamp circuit 540 extracts the current from the output node B to the ground GND after detecting that the output node C has become lower than the output node B by the threshold voltage |Vthp| of the MOS.

Thus, the clamp circuit 540 prevents a further increase in the potential of the output node B and clamps the potentials of the nodes B and C.

(3-5) Specific Circuit of Second Configuration Example of Comparator

Figure 27:
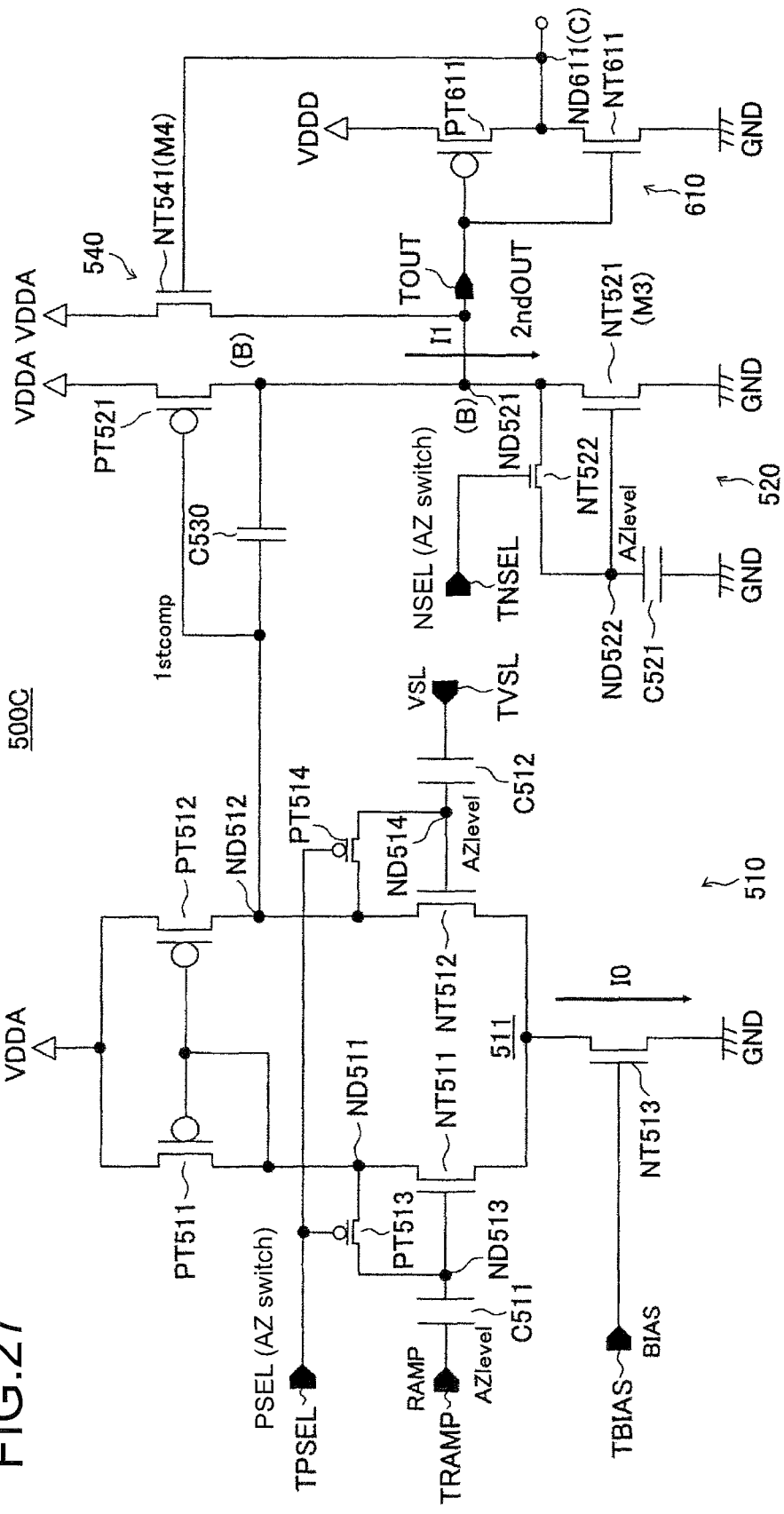
FIG. 27 is a circuit diagram showing the second configuration example of the comparator according to the embodiment.

FIG. 27 is a circuit diagram showing the second configuration example of the comparator according to the embodiment.

The comparator 500C shown in FIG. 27 is basically the same in configuration as the comparator 500 shown in FIG. 17 except for the connected position of the clamp circuit 540, and thus its detailed description will be omitted.

Note that in FIG. 27, a simple inverter is used as the first-stage logic gate 610 of the digital circuit 600, but the configuration of the embodiment of the present disclosure is not limited to it.

The logic gate 610 has a PMOS transistor PT611 and an NMOS transistor NT611 connected in series between a digital power supply voltage source VDDD and the ground potential GND serving as a reference potential.

The gates of the PMOS transistor PT611 and the NMOS transistor NT611 are commonly connected to the output node ND521 (B) of the second amplifier 520 of the comparator 500C.

Further, an output node ND611 (C) is formed at the connection point between the drain of the PMOS transistor PT611 and that of the NMOS transistor NT611.

The clamp circuit 540 has an NMOS transistor NT541. That is, the clamp circuit 540 employs the configuration shown in FIG. 16A.

The drain of the NMOS transistor NT541 is connected to an analog power supply voltage source VDDA for the comparator 500C, and the source thereof is connected to the output node ND521 (B) of the second amplifier 520.

The gate of the NMOS transistor NT541 is connected to the output node ND611 (C) of the logic gate 610.

As described above, the clamp circuit 540 is connected to the output node ND521 (B) of the second amplifier 520 and the output node ND611 (C) of the logic gate 610 in the comparator 500C.

The clamp circuit 540 detects a voltage of the output node ND521 (B) of the second amplifier 520 and that of the output node ND611 (C) of the logic gate 610.

In this case, the clamp circuit 540 detects that the output node ND611 (C) of the logic gate 610 has become higher than the output node ND521 (B) of the second amplifier 520 by the constant voltage Vth.

Specifically, in a case where the output node ND611 (C) of the logic gate 610 has become higher than the output node ND521 (B) of the second amplifier 520 by the constant voltage Vth, the clamp circuit 540 turns on the NMOS transistor NT541 and feeds a current from the power supply to the output node ND521 (B) of the second amplifier 520.

In this case, the NMOS transistor NT521 of the second amplifier 520 functions as the current source.

Then, the clamp circuit 540 performs clamp processing such that the potential of the output node ND521 (B) of the second amplifier 520 does not become lower than the threshold voltage Vthn of the NMOS transistor NT521 whose drain is connected to the node ND521. In other words, the clamp circuit 540 clamps the potential of the node ND531 (B) such that the NMOS transistor NT521 (M3) functioning as the current source satisfies and maintains its saturated operation condition.

Thus, the clamp circuit 540 prevents the potential of the node ND521 (B) from being lower than the constant potential and clamps the potentials of the nodes ND521 (B) and ND611 (C).

With such a function of the clamp circuit 540 described above, an improvement in a streaking phenomenon can be achieved.

Next, a description will be given of a reason why a streaking phenomenon can be improved.

Figure 28:
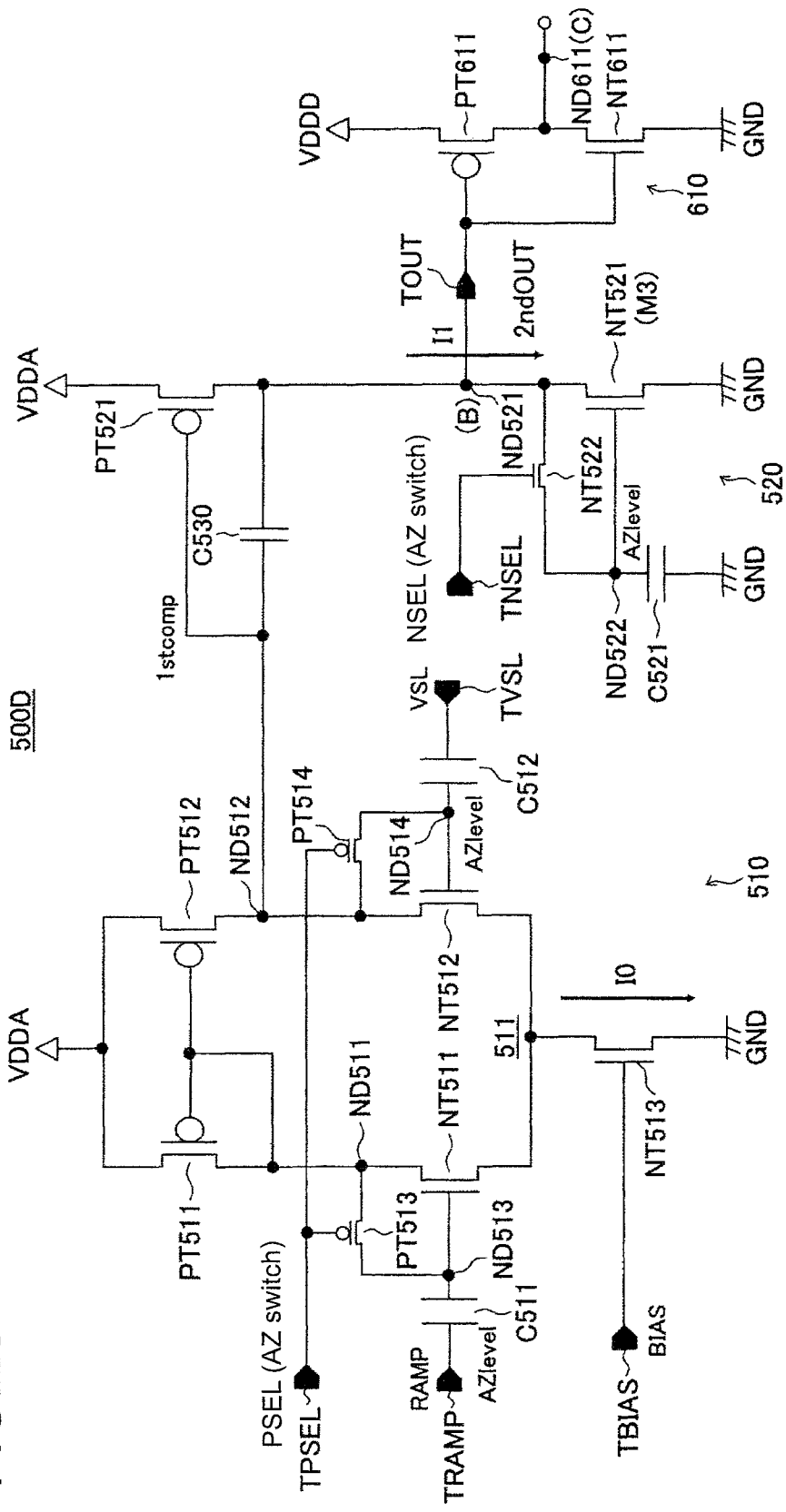
FIG. 28 is a circuit diagram showing the comparator having no clamp circuit as an example compared with the comparator shown in FIG. 27.

Prior to the description, a description will be first given of a reason why a streaking phenomenon occurs using a comparator shown in FIG. 28 having no clamp circuit as a comparison example.

(Reason Why Streaking Phenomenon Occurs)

First, a description will be given of the reason why a streaking phenomenon occurs, i.e., a reason for fluctuations in a consumption current when a comparator 500D is inverted.

FIG. 28 is a circuit diagram showing a comparator having no clamp circuit as an example compared with the comparator shown in FIG. 27.

Figure 29A:
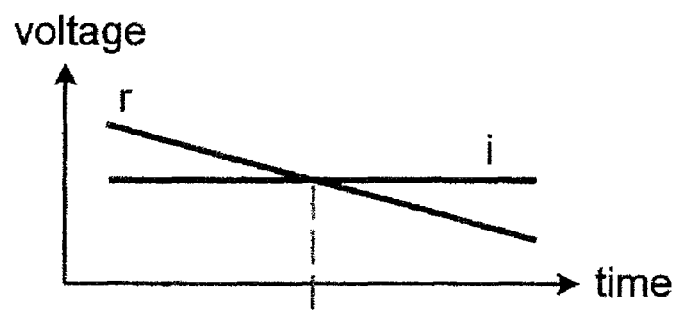
FIGS. 29A to 29C are diagrams showing operation waveforms of the comparator shown in FIG. 28.
Figure 29B:
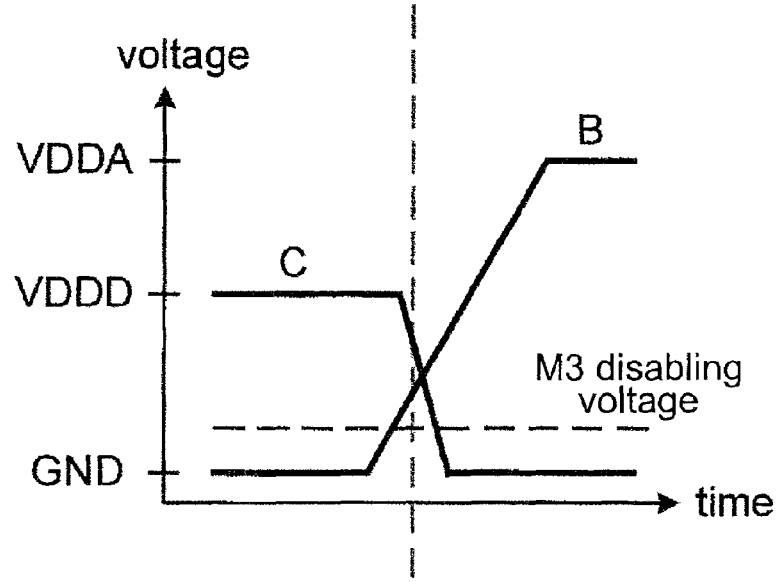
Figure 29C:
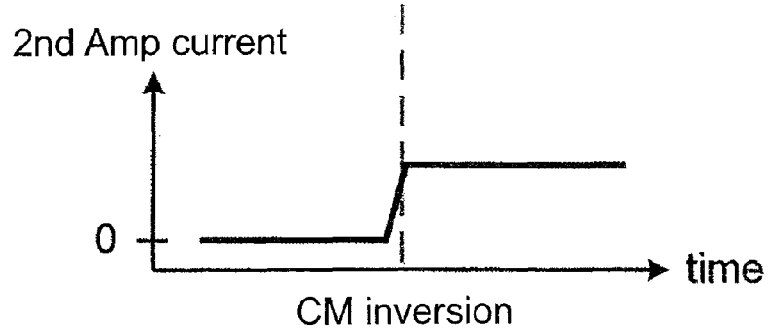

FIGS. 29A to 29C are diagrams showing operation waveforms of the comparator shown in FIG. 28.

Because the comparator 500D is equivalently an amplifier with a high gain, a voltage of the output node ND521 (B) of the comparator 500D greatly changes between the ground potential GND and the analog power supply voltage VDDA before and after the output of the comparator 500D.

If the voltage of the output node ND521 (B) of the second amplifier 520 is lower than a constant value, the transistor NT521 (M3) is not allowed to operate as the current source and thus hardly feeds a current.

Accordingly, as shown in FIGS. 29A to 29C, the NMOS transistor NT521 (M3) serving as the current source of the second amplifier 520 on the second stage changes from an ON state to an OFF state before and after the inversion of the output of the comparator 500D. As a result, the fluctuation in the consumption current occurs.

(Improvement in Streaking Phenomenon According to Embodiment of Present Disclosure)

FIGS. 30A to 30C are diagrams showing operation waveforms of the comparator shown in FIG. 27.

In the comparator 500C of the technology shown in FIG. 27, the clamp circuit 540 performs clamp processing such that the potential of the output node ND521 (B) is not excessively lowered.

As a result, as shown in FIGS. 30A to 30C, the NMOS transistor NT521 (M3) is free from its disablement (free from a state where the NMOS transistor NT521 (M3) does not satisfy the saturated operation condition).

Thus, the transistor M3 (NT521) operates as the current source at all times, and thus fluctuations in the consumption current of the second amplifier 520 on the second stage do not occur before and after the inversion of the output of the comparator 500C.

Accordingly, interference with other comparators via fluctuations in the power supply voltage does not occur, which results in an improvement in a streaking phenomenon.

(3-6) Modification of Second Configuration Example of Comparator

Figure 31:
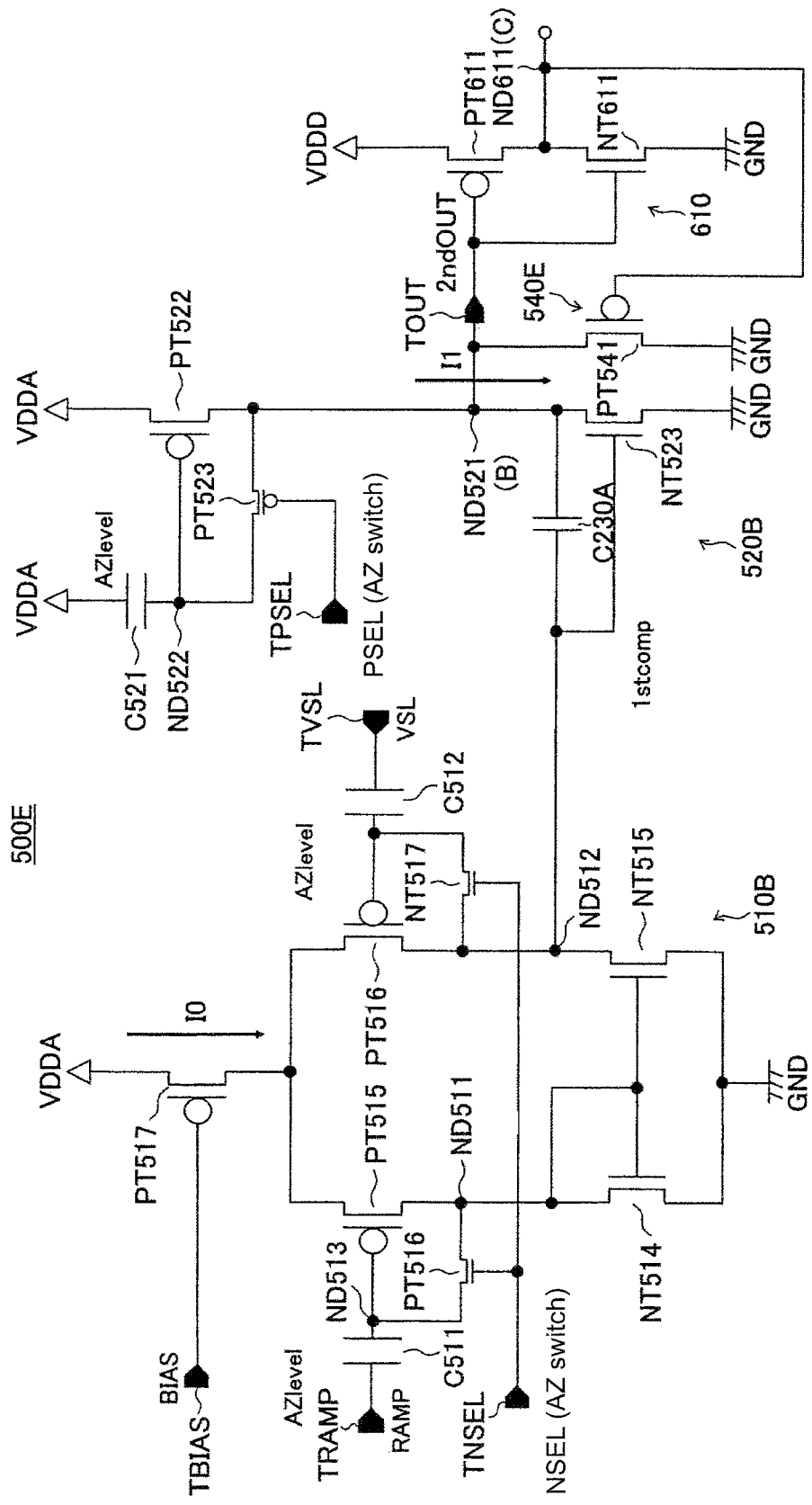
FIG. 31 is a circuit diagram showing a modification of the second configuration example of the comparator according to the embodiment.

FIG. 31 is a circuit diagram showing a modification of the second configuration example of the comparator according to the embodiment.

A comparator 500E shown in FIG. 31 has a polarity opposite to that of the transistors of the comparator 500C shown in FIG. 27. Therefore, the power supply potential and the ground potential connected to the comparator 500E are also oppositely arranged on the circuit.

Note that the relationship between the comparator 500E shown in FIG. 31 and the comparator 500C shown in FIG. 27 is the same as the relationship between the comparator 500B shown in FIG. 25 and the comparator 500 shown in FIG. 17 and thus its detailed description will be omitted.

A PMOS transistor PT541 constitutes a clamp circuit 540E instead of the NMOS transistor NT541 shown in FIG. 27. In this case, the drain of the PMOS transistor PT541 is connected to the ground potential GND.

The comparator 500E shown in FIG. 31 having such a configuration basically operates in the same manner as the comparator 500C shown in FIG. 27. However, the waveforms of RAMP, 1st comp, and 2nd Amp become opposite.

Further, the comparator 500E shown in FIG. 31 can obtain the same effect as that of the comparator 500C shown in FIG. 31.

According to the second configuration example described above, fluctuations in the current value of the current source circuit of the comparator can be reduced, thereby making it possible to reduce fluctuations in a power supply voltage, reduce an error in a comparison result, and reduce an error caused by interference with other circuits in a system (electronic apparatus) including the comparator.

In a single-slope AD converter using the comparator, particularly, in a plurality of parallel single-slope AD converters using a multiplicity of the comparators, each having a common slope fluctuations in the current values of the current source circuits of the comparators can be reduced, thereby making it becomes possible to reduce an error caused by the interference between the AD converters via fluctuations in a power supply voltage.

In a solid-state imaging device using column-parallel single-slope AD converters, fluctuations in a power supply voltage can be reduced with a reduction in fluctuations in the current value of the current source circuit of the comparator, thereby making it possible to reduce an error caused by the interference between the AD converters via a slope waveform and reduce the degradation of image quality.

Thus, according to the second configuration example, it becomes possible for the comparator to reduce noise (error) caused in a power supply, improve the precision of a system, and reduce an error in AD conversion and the degradation of image quality due to the interference between AD converters and the interference between columns.

(3-7) Specific Circuit of Third Configuration Example of Comparator

Figure 32:
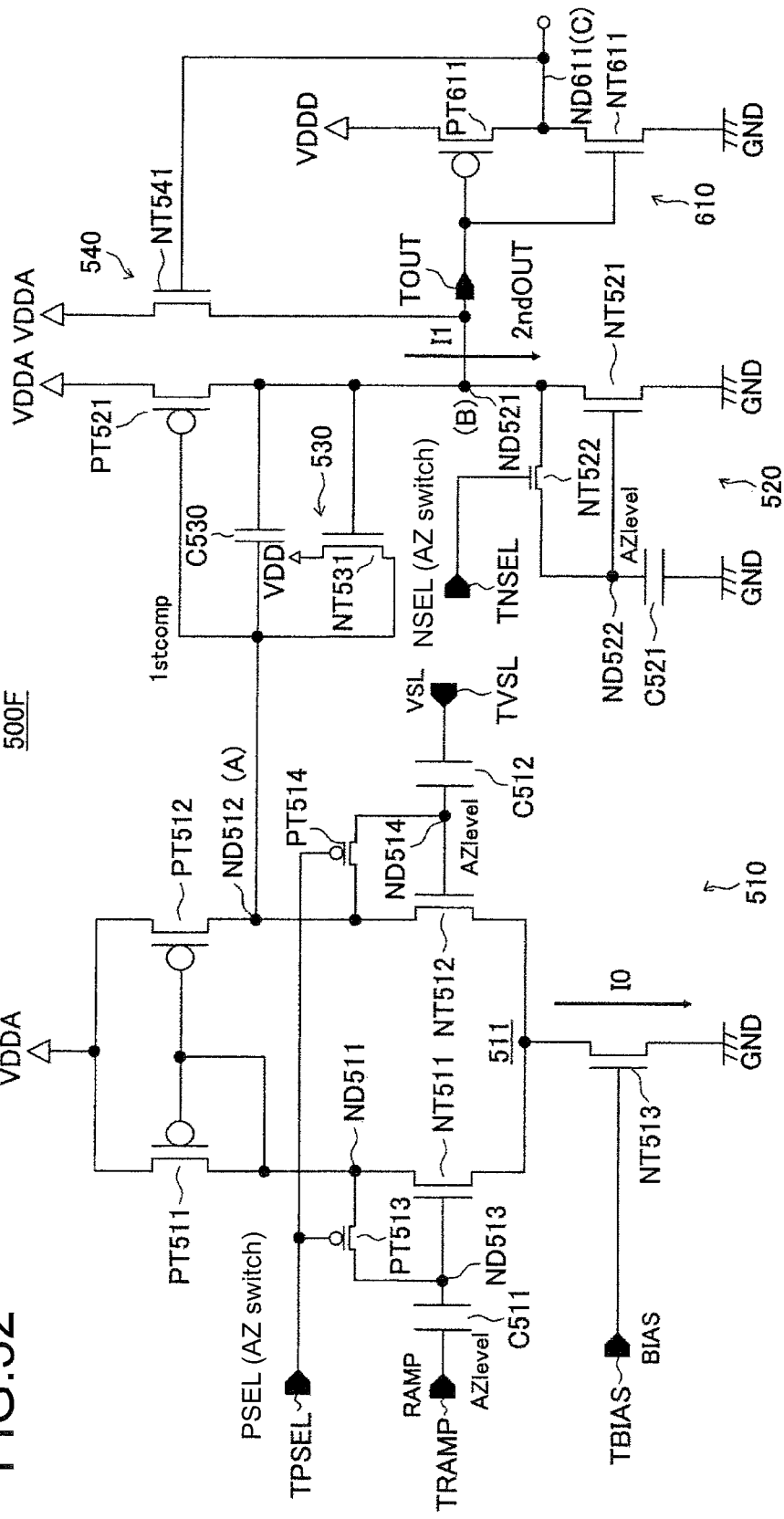
FIG. 32 is a circuit diagram showing a third configuration example of a comparator according to the embodiment.

FIG. 32 is a circuit diagram showing a third configuration example of a comparator according to the embodiment.

A comparator 500F shown in FIG. 32 has both the clamp circuit 530 of the comparator 500 shown in FIG. 17 as a first configuration and the clamp circuit 540 of the comparator 500C shown in FIG. 27 as a second configuration.

Because the specific configurations of the clamp circuits 530 and 540 are described in association with FIGS. 17 and 27, respectively, their detailed descriptions will be omitted.

The comparator 500F shown in FIG. 32 has both the effect of the first configuration and the effect of the second configuration.

(3-8) Modification of Third Configuration Example of Comparator

Figure 33:
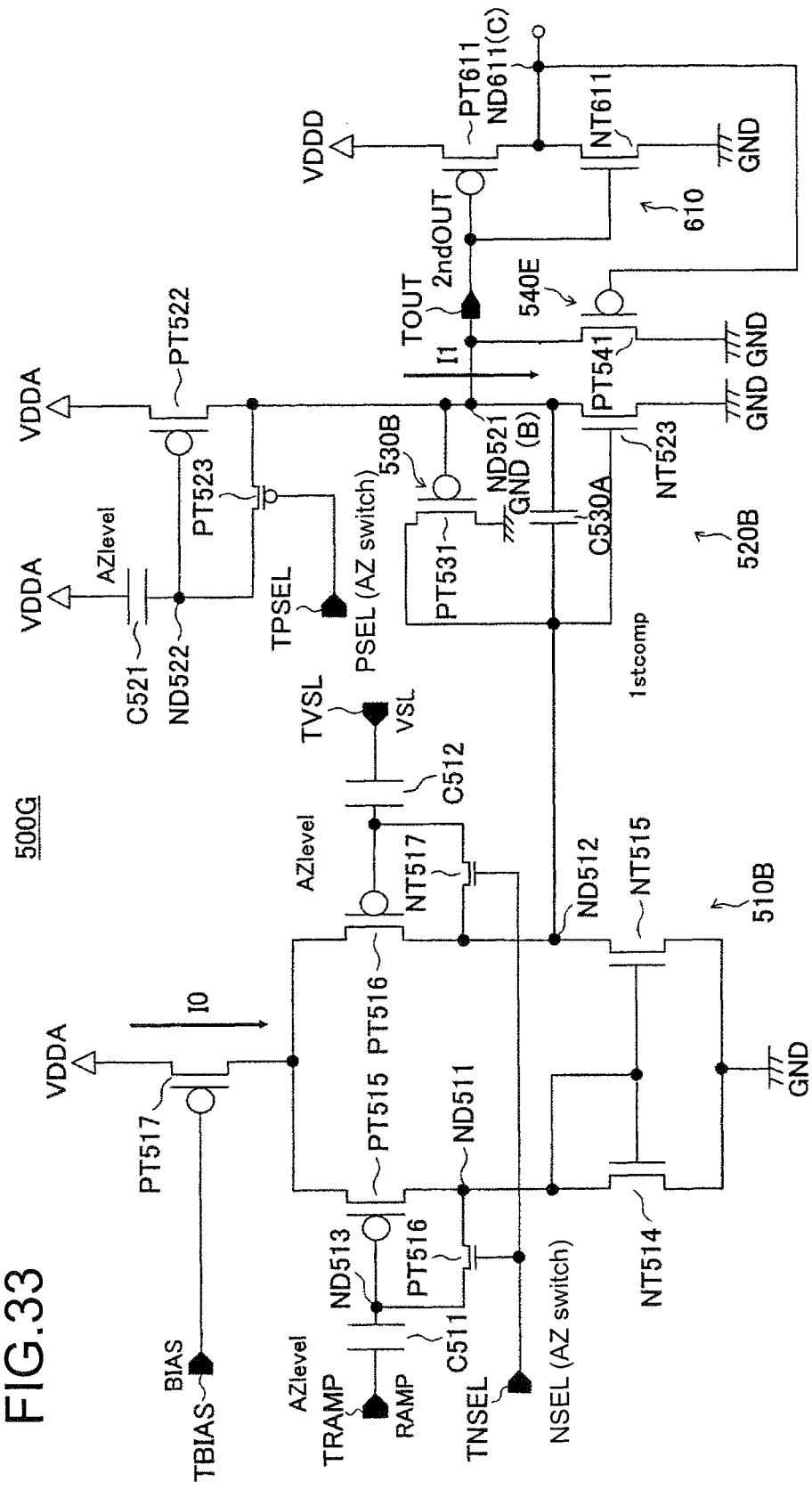
FIG. 33 is a circuit diagram showing a modification of the third configuration example of the comparator according to the embodiment.

FIG. 33 is a circuit diagram showing a modification of the third configuration example of the comparator according to the embodiment.

A comparator 500G shown in FIG. 33 has both the clamp circuit 530B of the comparator 500B shown in FIG. 25 as a first configuration and the clamp circuit 540E of the comparator 500E shown in FIG. 31 as a second configuration.

Because the specific configurations of the clamp circuits 530B and 540E are described in association with FIGS. 25 and 31, respectively, their detailed descriptions will be omitted.

The comparator 500G shown in FIG. 33 has both the effect of the first configuration and the effect of the second configuration.

Further, the comparator of the first configuration according to the embodiment is composed of the clamp circuit 530 connected to the output node A of the first amplifier 510 on the first stage and connected to the output node B of the second amplifier 520 on the second stage.

Thus, according to the embodiment, it becomes possible for the comparator to reduce an error caused in an input waveform, improve the precision of a system, and reduce an error in AD conversion and the degradation of image quality due to the interference between AD converters and the interference between columns.

Further, in the comparator of the second configuration according to the embodiment, the clamp circuit 540 is connected to the output of the comparator 500C, i.e., the output node B of the second amplifier 520 on the second stage and connected to the output node C of the first-stage inversion gate of the logic gate 610.

Thus, according to the embodiment, it becomes possible for the comparator to reduce noise (error) caused in a power supply, improve the precision of a system, and reduce an error in AD conversion and the degradation of image quality due to the interference between AD converters and the interference between columns.

Further, according to the embodiment, the following effects can be obtained.

According to the embodiment of the present disclosure, it becomes possible to reduce the number of TCVs compared with existing laminated structures without causing an error in transmission signals. Further, it is not necessary to provide circuits such as quantizers (comparators) on an analog chip. Thus, an area of the analog chip can be reduced in size to a level determined only by sensors.

For example, because an area of sensors (pixels) in an image sensor is determined by an optical size of a system, an analog chip can be generally reduced to nearly its limit size at which the analog chip can be minimized.

As described above, it takes more steps to manufacture an analog chip than manufacturing a logic chip (digital chip). Therefore, even if the areas of the chips are the same, the analog chip becomes higher in manufacturing cost than the logic chip.

Further, according to the embodiment of the present disclosure, circuits arranged on an analog chip can be limited to those related to sensors. Therefore, it becomes possible to eliminate steps related to wiring and manufacturing of transistors. In general, transistors for manufacturing circuits such as comparators and transistors for constituting sensors are manufactured in steps including not common steps. Accordingly, with the elimination of circuits such as comparators, these steps can be eliminated.

Similarly, because it is not necessary to arrange complicated wirings on an analog chip, a total wiring number can be reduced.

From the two reasons above, it becomes possible to greatly reduce a manufacturing cost of a semiconductor device without degrading signals output from sensors according to the embodiment of the present disclosure.

Note that the above embodiment describes the configurations of the CMOS image sensors as examples of semiconductor device. In addition, the above configurations can be applied to, for example, backside illumination CMOS image sensors to achieve the above effects. However, the above effects can also be fully achieved when the configurations are applied to front side illumination CMOS image sensors.

Solid-state imaging devices having such configurations can be applied as imaging devices such as digital cameras and video cameras.

(4) Configuration Example of Camera System

Figure 34:
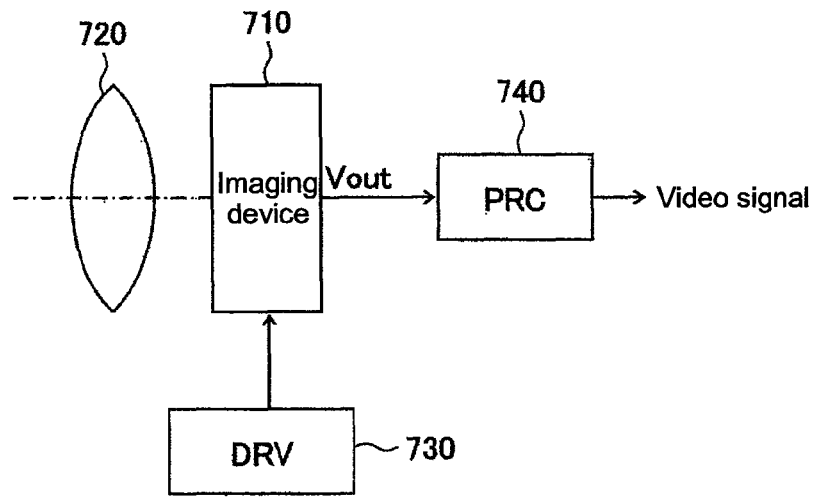
FIG. 34 is a diagram showing an example of the configuration of a camera system to which a solid-state imaging device according to the embodiment is applied.

FIG. 34 is a diagram showing an example of the configuration of a camera system to which the solid-state imaging device according to the embodiment is applied.

As shown in FIG. 34, a camera system 700 has an imaging device 710 to which the CMOS image sensors (solid-state imaging devices) 200, 300, and 300A to 300C according to the embodiment can be applied.

Moreover, the camera system 700 has an optical system that guides incident light (forms a subject image on) to a pixel region of the imaging device 710, e.g., a lens 720 that forms an image of incident light (image light) on an imaging surface.

The camera system 700 has a drive circuit (DRV) 730 that drives the imaging device 710 and a signal processing circuit (PRC) 740 that processes signals output from the imaging device 710.

The drive circuit 730 has a timing generator (not shown) that generates various timing signals including a start pulse and a clock pulse for driving circuits inside the imaging device 710. Based on a predetermined timing signal, the drive circuit 730 drives the imaging device 710.

Further, the signal processing circuit 740 applies predetermined signal processing to the signals output from the imaging device 710.

The image signals processed by the signal processing circuit 740 are recorded on, for example, a recording medium such as a memory. The image information recorded on the recording medium is printed on a sheet (hard copy) by a printer or the like. Further, the image signals processed by the signal processing circuit 740 are displayed as moving pictures on a monitor composed of a liquid crystal display or the like.

As described above, a high-precision camera can be realized with the installation of any of the solid-state imaging devices 200, 300, and 300A to 300C as the imaging device 710 in an imaging apparatus such as a digital camera.

Further, the comparator, the AD converter, the solid-state imaging device, and the camera system (imaging apparatus) according to the embodiment are applicable to electronic apparatuses such as mobile phones, personal computers (PCs), and TV sets.

(5) Application to Electronic Apparatus

Figure 35:
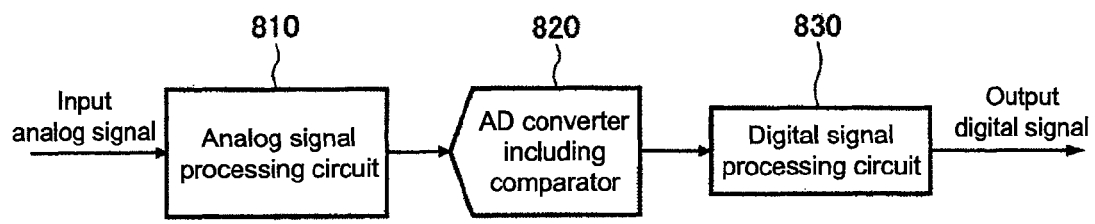
FIG. 35 is a diagram showing a configuration example of a signal processing system of an electronic apparatus to which the comparator, the AD converter, the solid-state imaging device, and the camera system according to the embodiment are applied.

FIG. 35 is a diagram showing a configuration example of a signal processing system in an electronic apparatus to which the comparator, the AD converter, the solid-state imaging device, or the camera system according to the embodiment is applied.

A processing system 800 shown in FIG. 35 has an analog signal processing circuit 810, an AD converter 820 including the comparator according to the embodiment, and a digital signal processing circuit 830.

As described above, the comparator and the AD converter according to the embodiment can be applied to a signal processing system in an electronic apparatus. Similarly, the solid-state imaging device and the camera system can also be applied to various electronic apparatuses.

Note that the present disclosure may employ the following configurations.

(1) A comparator, including:

a first amplifier including differential-pair transistors and configured to output a signal of a level corresponding to a comparison result from a first output node, the differential-pair transistors serving as a comparison part configured to compare a reference voltage with a potential of an input signal;

a second amplifier configured to gain up the signal output from the first output node of the first amplifier and output the signal from a second output node; and a level holding part configured to hold a level of the second output node at a predetermined level, the second amplifier including a transistor for amplification connected between the second output node and a power supply or a reference potential source and a transistor for a current source connected between the second output node and the reference potential source or the power supply, the level holding part holding the level of the second output node of the second amplifier such that the transistor for the current source of the second amplifier does not fall into a level at which a saturated operation condition is not satisfied.

(2) The comparator according to (1), in which the level holding part includes a clamp circuit configured to perform clamp processing so as not to change a potential of the second output node when a third output node of a logic gate connected to the second output node of the second amplifier has become higher or lower than the second output node of the second amplifier by a constant voltage.

(3) The comparator according to (2), in which the clamp circuit performs the clamp processing so as not to change the potential of the second output node in such a manner that the clamp circuit turns on the current source to feed a current from the power supply or the reference potential source to the second output node or feed the current out from the second output node after detecting that the third output node of the logic gate has become higher or lower than the second output node of the second amplifier by the constant voltage.

(4) The comparator according to (2) or (3), in which the clamp circuit includes a transistor connected between the second output node and the power supply or the reference potential source, a conduction state of the transistor being controlled in accordance with a voltage of a control terminal of the transistor, and the control terminal of the transistor is connected to the third output node.

(5) The comparator according to any one of (1) to (4), in which the first amplifier includes the differential-pair transistors and is configured to output the signal of the level corresponding to the comparison result from the first output node, the differential-pair transistors serving as the comparison part configured to receive the reference voltage, a signal level of which changes with a slope, at a gate of one of the differential-pair transistors, to receive the input signal at a gate of the other of the differential-pair transistors, and to compare the reference voltage with the potential of the input signal, and the comparator further includes a level holding part for the first output node configured to hold a level of the first output node of the first amplifier such that the other transistor having an output part thereof connected to the first output node out of the differential-pair transistors of the first amplifier does not fall into the level at which the saturated operation condition is not satisfied.

(6) The comparator according to (5), in which the level holding part for the first output node includes a clamp circuit configured to perform clamp processing so as not to change potentials of the first output node and the second output node when the second output node of the second amplifier has become higher or lower than the first output node of the first amplifier by the constant voltage.

(7) The comparator according to any one of (1) to (6), in which the first amplifier includes a pair of transistors on a load side of the differential-pair transistors and a switch for initialization connected between a gate and a drain of the differential-pair transistors and configured to determine an operating point at starting a row operation, one of the pair of transistors on the load side is connected to the first output node, and the output part of one of the differential-pair transistors is connected to the first output node.

(8) An analog-to-digital converter, including:

a comparator configured to compare a reference voltage, a signal level of which changes with a slope, with an input signal for determination and to output a signal of the determination; and a counter configured to count a comparison time of the comparator to obtain a digital signal, the comparator including a first amplifier including differential-pair transistors and configured to output a signal of a level corresponding to a comparison result from a first output node, the differential-pair transistors serving as a comparison part configured to compare the reference voltage with a potential of the input signal, a second amplifier configured to gain up the signal output from the first output node of the first amplifier and output the signal from a second output node, and a level holding part configured to hold a level of the second output node at a predetermined level, the second amplifier including a transistor for amplification connected between the second output node and a power supply or a reference potential source and a transistor for a current source connected between the second output node and the reference potential source or the power supply, the level holding part holding the level of the second output node of the second amplifier such that the transistor for the current source of the second amplifier does not fall into a level at which a saturated operation condition is not satisfied.

(9) The analog-to-digital converter according to (8), in which the level holding part includes a clamp circuit configured to perform clamp processing so as not to change a potential of the second output node when a third output node of a logic gate connected to the second output node of the second amplifier has become higher or lower than the second output node of the second amplifier by a constant voltage.

(10) The analog-to-digital converter according to (9), in which the clamp circuit performs the clamp processing so as not to change the potential of the second output node in such a manner that the clamp circuit turns on the current source to feed a current from the power supply or the reference potential source to the second output node or feed the current out from the second output node after detecting that the third output node of the logic gate has become higher or lower than the second output node of the second amplifier by the constant voltage.

(11) The analog-to-digital converter according to (9) or (10), in which
the clamp circuit includes a transistor connected between the second output node and the power supply or the reference potential source, a conduction state of the transistor being controlled in accordance with a voltage of a control terminal of the transistor, and
the control terminal of the transistor is connected to the third output node.

(12) The analog-to-digital converter according to any one of (8) to (11), in which
the first amplifier includes the differential-pair transistors and is configured to output the signal of the level corresponding to the comparison result from the first output node,
the differential-pair transistors serving as the comparison part configured
to receive the reference voltage, a signal level of which changes with a slope, at a gate of one of the differential-pair transistors,
to receive the input signal at a gate of the other of the differential-pair transistors, and
to compare the reference voltage with the potential of the input signal, and
the comparator further includes
a level holding part for the first output node configured to hold a level of the first output node of the first amplifier such that the other transistor having an output part thereof connected to the first output node out of the differential-pair transistors of the first amplifier does not fall into the level at which the saturated operation condition is not satisfied.

(13) The analog-to-digital converter according to (12), in which
the level holding part for the first output node includes
a clamp circuit configured to perform clamp processing so as not to change potentials of the first output node and the second output node when the second output node of the second amplifier has become higher or lower than the first output node of the first amplifier by the constant voltage.

(14) The analog-to-digital converter according to any one of (8) to (13), in which
the first amplifier includes
a pair of transistors on a load side of the differential-pair transistors and
a switch for initialization connected between a gate and a drain of the differential-pair transistors and configured to determine an operating point at starting a row operation,
one of the pair of transistors on the load side is connected to the first output node, and
the output part of one of the differential-pair transistors is connected to the first output node.

(15) A solid-state imaging device, including:
a pixel array part having a plurality of pixels arranged in matrix form, the pixels being configured to perform photoelectric conversion; and
a pixel signal reading part configured to read pixel signals in units of the plurality of pixels from the pixel array part,
the pixel signal reading part including an analog-to-digital converter configured to convert an analog reading signal into a digital signal,
the analog-to-digital converter including
a comparator configured
to compare a reference voltage, a signal level of which changes with a slope, with an input signal for determination and
to output a signal of the determination, and
a counter configured to count a comparison time of the comparator to obtain a digital signal,
the comparator including
first amplifier including differential-pair transistors and configured to output a signal of a level corresponding to a comparison result from a first output node,
the differential-pair transistors serving as a comparison part configured to compare the reference voltage with the potential of the input signal,
a second amplifier configured to gain up the signal output from the first output node of the first amplifier and output the signal from a second output node, and
a level holding part configured to hold a level of the second output node at a predetermined level,
the second amplifier including
a transistor for amplification connected between the second output node and a power supply or a reference potential source and
a transistor for a current source connected between the second output node and the reference potential source or the power supply,
the level holding part holding the level of the second output node of the second amplifier such that the transistor for the current source of the second amplifier does not fall into a level at which a saturated operation condition is not satisfied.

(16) A camera system, including:
a solid-state imaging device; and
an optical system configured to form a subject image on the solid-state imaging device,
the solid-state imaging device including
a pixel array part having a plurality of pixels arranged in matrix form, the pixels being configured to perform photoelectric conversion, and
a pixel signal reading part configured to read pixel signals in units of the plurality of pixels from the pixel array part,
the pixel signal reading part including an analog-to-digital converter configured to convert an analog reading signal into a digital signal,
the analog-to-digital converter including
a comparator configured
to compare a reference voltage, a signal level of which changes with a slope, with an input signal for determination and
to output a signal of the determination, and
a counter configured to count a comparison time of the comparator to obtain a digital signal,
the comparator including
a first amplifier including differential-pair transistors and configured to output a signal of a level corresponding to a comparison result from a first output node,
the differential-pair transistors serving as a comparison part configured to compare a reference voltage with a potential of an input signal,
a second amplifier configured to gain up the signal output from the first output node of the first amplifier and output the signal from a second output node, and
a level holding part configured to hold a level of the second output node at a predetermined level,
the second amplifier including a transistor for amplification connected between the second output node and a power supply or a reference potential source and a transistor for a current source connected between the second output node and the reference potential source or the power supply, the level holding part holding the level of the second output node of the second amplifier such that the transistor for the current source of the second amplifier does not fall into a level at which a saturated operation condition is not satisfied.

(17) An electronic apparatus, including:

at least a comparator for use in a signal processing system, the comparator including a first amplifier including differential-pair transistors and configured to output a signal of a level corresponding to a comparison result from a first output node, the differential-pair transistors serving as a comparison part configured to compare a reference voltage with a potential of an input signal, a second amplifier configured to gain up the signal output from the first output node of the first amplifier and output the signal from a second output node, and a level holding part configured to hold a level of the second output node at a predetermined level, the second amplifier including a transistor for amplification connected between the second output node and a power supply or a reference potential source and a transistor for a current source connected between the second output node and the reference potential source or the power supply, the level holding part holding the level of the second output node of the second amplifier such that the transistor for the current source of the second amplifier does not fall into a level at which a saturated operation condition is not satisfied.

The present disclosure contains subject matter related to that disclosed in Japanese Priority Patent Application JP 2012-034394 filed in the Japan Patent Office on Feb. 20, 2012, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A comparator, comprising:

a first amplifier including differential-pair transistors and configured to output a signal of a level corresponding to a comparison result from a first output node, the differential-pair transistors serving as a comparison part configured to compare a reference voltage with a potential of an input signal;

a second amplifier configured to gain up the signal output from the first output node of the first amplifier and output the signal from a second output node; and a level holding part configured to hold a level of the second output node at a predetermined level, the second amplifier including a transistor for amplification connected between the second output node and a power supply or a reference potential source and a transistor for a current source connected between the second output node and the reference potential source or the power supply, the level holding part holding the level of the second output node of the second amplifier such that the transistor for the current source of the second amplifier does not fall into a level at which a saturated operation condition is not satisfied.

2. The comparator according to claim 1, wherein the level holding part includes a clamp circuit configured to perform clamp processing so as not to change a potential of the second output node when a third output node of a logic gate connected to the second output node of the second amplifier has become higher or lower than the second output node of the second amplifier by a constant voltage.

3. The comparator according to claim 2, wherein the clamp circuit performs the clamp processing so as not to change the potential of the second output node in such a manner that the clamp circuit turns on the current source to feed a current from the power supply or the reference potential source to the second output node or feed the current out from the second output node after detecting that the third output node of the logic gate has become higher or lower than the second output node of the second amplifier by the constant voltage.

4. The comparator according to claim 2, wherein the clamp circuit includes a transistor connected between the second output node and the power supply or the reference potential source, a conduction state of the transistor being controlled in accordance with a voltage of a control terminal of the transistor, and the control terminal of the transistor is connected to the third output node.

5. The comparator according to claim 1, wherein the first amplifier includes the differential-pair transistors and is configured to output the signal of the level corresponding to the comparison result from the first output node, the differential-pair transistors serving as the comparison part configured to receive the reference voltage, a signal level of which changes with a slope, at a gate of one of the differential-pair transistors, to receive the input signal at a gate of the other of the differential-pair transistors, and to compare the reference voltage with the potential of the input signal, and the comparator further includes a level holding part for the first output node configured to hold a level of the first output node of the first amplifier such that the other transistor having an output part thereof connected to the first output node out of the differential-pair transistors of the first amplifier does not fall into the level at which the saturated operation condition is not satisfied.

6. The comparator according to claim 5, wherein the level holding part for the first output node includes a clamp circuit configured to perform clamp processing so as not to change potentials of the first output node and the second output node when the second output node of the second amplifier has become higher or lower than the first output node of the first amplifier by the constant voltage.

7. The comparator according to claim 1, wherein
the first amplifier includes
a pair of transistors on a load side of the differential-pair transistors and
a switch for initialization connected between a gate and a drain of the differential-pair transistors and configured to determine an operating point at starting a row operation,
one of the pair of transistors on the load side is connected to the first output node, and
the output part of one of the differential-pair transistors is connected to the first output node.

8. An analog-to-digital converter, comprising:
a comparator configured
to compare a reference voltage, a signal level of which changes with a slope, with an input signal for determination and
to output a signal of the determination; and
a counter configured to count a comparison time of the comparator to obtain a digital signal,
the comparator including
a first amplifier including differential-pair transistors and configured to output a signal of a level corresponding to a comparison result from a first output node,
the differential-pair transistors serving as a comparison part configured to compare the reference voltage with a potential of the input signal,
a second amplifier configured to gain up the signal output from the first output node of the first amplifier and output the signal from a second output node, and
a level holding part configured to hold a level of the second output node at a predetermined level,
the second amplifier including
a transistor for amplification connected between the second output node and a power supply or a reference potential source and
a transistor for a current source connected between the second output node and the reference potential source or the power supply,
the level holding part holding the level of the second output node of the second amplifier such that the transistor for the current source of the second amplifier does not fall into a level at which a saturated operation condition is not satisfied.

9. The analog-to-digital converter according to claim 8, wherein
the level holding part includes
a clamp circuit configured to perform clamp processing so as not to change a potential of the second output node when a third output node of a logic gate connected to the second output node of the second amplifier has become higher or lower than the second output node of the second amplifier by a constant voltage.

10. The analog-to-digital converter according to claim 9, wherein
the clamp circuit performs the clamp processing so as not to change the potential of the second output node in such a manner that the clamp circuit turns on the current source to feed a current from the power supply or the reference potential source to the second output node or feed the current out from the second output node after detecting that the third output node of the logic gate has become higher or lower than the second output node of the second amplifier by the constant voltage.

11. The analog-to-digital converter according to claim 9, wherein
the clamp circuit includes a transistor connected between the second output node and the power supply or the reference potential source, a conduction state of the transistor being controlled in accordance with a voltage of a control terminal of the transistor, and
the control terminal of the transistor is connected to the third output node.

12. The analog-to-digital converter according to claim 8, wherein
the first amplifier includes the differential-pair transistors and is configured to output the signal of the level corresponding to the comparison result from the first output node,
the differential-pair transistors serving as the comparison part configured
to receive the reference voltage, a signal level of which changes with a slope, at a gate of one of the differential-pair transistors,
to receive the input signal at a gate of the other of the differential-pair transistors, and
to compare the reference voltage with the potential of the input signal, and
the comparator further includes
a level holding part for the first output node configured to hold a level of the first output node of the first amplifier such that the other transistor having an output part thereof connected to the first output node out of the differential-pair transistors of the first amplifier does not fall into the level at which the saturated operation condition is not satisfied.

13. The analog-to-digital converter according to claim 12, wherein
the level holding part for the first output node includes
a clamp circuit configured to perform clamp processing so as not to change potentials of the first output node and the second output node when the second output node of the second amplifier has become higher or lower than the first output node of the first amplifier by the constant voltage.

14. The analog-to-digital converter according to claim 8, wherein
the first amplifier includes
a pair of transistors on a load side of the differential-pair transistors and
a switch for initialization connected between a gate and a drain of the differential-pair transistors and configured to determine an operating point at starting a row operation,
one of the pair of transistors on the load side is connected to the first output node, and
the output part of one of the differential-pair transistors is connected to the first output node.

15. A solid-state imaging device, comprising:
a pixel array part having a plurality of pixels arranged in matrix form, the pixels being configured to perform photoelectric conversion; and
a pixel signal reading part configured to read pixel signals in units of the plurality of pixels from the pixel array part,
the pixel signal reading part including an analog-to-digital converter configured to convert an analog reading signal into a digital signal,
the analog-to-digital converter including
a comparator configured
to compare a reference voltage, a signal level of which changes with a slope, with an input signal for determination and
to output a signal of the determination, and a counter configured to count a comparison time of the comparator to obtain a digital signal, the comparator including a first amplifier including differential-pair transistors and configured to output a signal of a level corresponding to a comparison result from a first output node, the differential-pair transistors serving as a comparison part configured to compare the reference voltage with the potential of the input signal, a second amplifier configured to gain up the signal output from the first output node of the first amplifier and output the signal from a second output node, and a level holding part configured to hold a level of the second output node at a predetermined level, the second amplifier including a transistor for amplification connected between the second output node and a power supply or a reference potential source and a transistor for a current source connected between the second output node and the reference potential source or the power supply, the level holding part holding the level of the second output node of the second amplifier such that the transistor for the current source of the second amplifier does not fall into a level at which a saturated operation condition is not satisfied.

16. A camera system, comprising:

a solid-state imaging device; and an optical system configured to form a subject image on the solid-state imaging device, the solid-state imaging device including a pixel array part having a plurality of pixels arranged in matrix form, the pixels being configured to perform photoelectric conversion, and a pixel signal reading part configured to read pixel signals in units of the plurality of pixels from the pixel array part, the pixel signal reading part including an analog-to-digital converter configured to convert an analog reading signal into a digital signal, the analog-to-digital converter including a comparator configured to compare a reference voltage, a signal level of which changes with a slope, with an input signal for determination and to output a signal of the determination, and a counter configured to count a comparison time of the comparator to obtain a digital signal, the comparator including a first amplifier including differential-pair transistors and configured to output a signal of a level corresponding to a comparison result from a first output node, the differential-pair transistors serving as a comparison part configured to compare a reference voltage with a potential of an input signal, a second amplifier configured to gain up the signal output from the first output node of the first amplifier and output the signal from a second output node, and a level holding part configured to hold a level of the second output node at a predetermined level, the second amplifier including a transistor for amplification connected between the second output node and a power supply or a reference potential source and a transistor for a current source connected between the second output node and the reference potential source or the power supply, the level holding part holding the level of the second output node of the second amplifier such that the transistor for the current source of the second amplifier does not fall into a level at which a saturated operation condition is not satisfied.

17. An electronic apparatus, comprising:

at least a comparator for use in a signal processing system, the comparator including a first amplifier including differential-pair transistors and configured to output a signal of a level corresponding to a comparison result from a first output node, the differential-pair transistors serving as a comparison part configured to compare a reference voltage with a potential of an input signal, a second amplifier configured to gain up the signal output from the first output node of the first amplifier and output the signal from a second output node, and a level holding part configured to hold a level of the second output node at a predetermined level, the second amplifier including a transistor for amplification connected between the second output node and a power supply or a reference potential source and a transistor for a current source connected between the second output node and the reference potential source or the power supply, the level holding part holding the level of the second output node of the second amplifier such that the transistor for the current source of the second amplifier does not fall into a level at which a saturated operation condition is not satisfied.

* * * * *